(12) United States Patent
Lee et al.

(10) Patent No.: US 10,903,548 B2
(45) Date of Patent: Jan. 26, 2021

(54) ANTENNA MODULE

(71) Applicant: SAMSUNG ELECTRONICS CO., LTD., Suwon-si (KR)

(72) Inventors: Yong Koon Lee, Suwon-si (KR); Jin Su Kim, Suwon-si (KR)

(73) Assignee: SAMSUNG ELECTRONICS CO.. LTD., Suwon-si (KR)

( * ) Notice: Subject to any disclaimer, the term of this patent is extended or adjusted under 35 U.S.C. 154(b) by 0 days.

(21) Appl. No.: 16/410,853

(22) Filed: May 13, 2019

(65) Prior Publication Data

US 2020/0185815 A1 Jun. 11, 2020

(30) Foreign Application Priority Data

Dec. 6, 2018 (KR) ........................ 10-2018-0155754

(51) Int. Cl.
*H01Q 1/22* (2006.01)
*H01Q 1/48* (2006.01)
(Continued)

(52) U.S. Cl.
CPC ....... *H01Q 1/2283* (2013.01); *H01L 21/4853* (2013.01); *H01L 21/4857* (2013.01); *H01L 21/565* (2013.01); *H01L 23/3128* (2013.01); *H01L 23/3677* (2013.01); *H01L 23/5383* (2013.01); *H01L 23/5386* (2013.01); *H01L 23/5389* (2013.01); *H01L 23/552* (2013.01); *H01L 23/66* (2013.01); *H01L 24/19* (2013.01); *H01L 24/20* (2013.01); *H01Q 1/48* (2013.01); *H01Q 9/16* (2013.01); *H01L 2223/6677* (2013.01); *H01L 2224/214* (2013.01);
(Continued)

(58) Field of Classification Search
CPC ............ H01Q 1/24; H01Q 1/38; H01Q 1/243; H01Q 1/2283; H01Q 21/0006; H01Q 21/28; H01L 23/055; H01L 23/295
USPC ................................................... 343/700 MS
See application file for complete search history.

(56) References Cited

U.S. PATENT DOCUMENTS 7,852,281 B2 * 12/2010 Choudhury ............ H01Q 23/00
343/851
10,319,688 B2 * 6/2019 Wolter .................. H01L 23/552
(Continued)

FOREIGN PATENT DOCUMENTS

KR   10-2005-0084978 A   8/2005
KR   10-2010-0051270 A   5/2010

*Primary Examiner* — Tung X Le
(74) *Attorney, Agent, or Firm* — Sughrue Mion, PLLC

(57) ABSTRACT

An antenna module includes an antenna substrate having a first surface and a second surface disposed to oppose each other, and including a substrate wiring layer having a first antenna pattern positioned in a first region, a second antenna pattern disposed in a second region adjacent to one side, and first and second feed patterns connected to the first and second antenna patterns, respectively; and a semiconductor package including a connection structure disposed on the second surface except for an area overlapping with the second region of the antenna substrate and redistribution layers electrically connected to the substrate wiring layer, and at least one semiconductor chip having connection pads connected to the redistribution layers. A region overlapping with the second feed pattern in each of the plurality of redistribution layers is provided as an opened region.

18 Claims, 19 Drawing Sheets

(51) Int. Cl.

| | |
|---|---|
| *H01L 23/31* | (2006.01) |
| *H01L 23/538* | (2006.01) |
| *H01L 23/367* | (2006.01) |
| *H01L 23/552* | (2006.01) |
| *H01L 23/66* | (2006.01) |
| *H01L 23/00* | (2006.01) |
| *H01L 21/48* | (2006.01) |
| *H01L 21/56* | (2006.01) |
| *H01Q 9/16* | (2006.01) |

(52) U.S. Cl.
CPC ............... *H01L 2924/19105* (2013.01); *H01L 2924/3025* (2013.01)

(56) References Cited

U.S. PATENT DOCUMENTS

| | | |
|---|---|---|
| 10,547,119 B2 * | 1/2020 | Kim, II ................... H01Q 21/28 |
| 10,580,745 B1 * | 3/2020 | Wieland .............. H01L 23/5389 |
| 2006/0033664 A1 | 2/2006 | Castany et al. |
| 2012/0280860 A1 | 11/2012 | Kamgaing et al. |
| 2016/0240492 A1 | 8/2016 | Wolter et al. |
| 2018/0159203 A1 * | 6/2018 | Baks ..................... H01Q 9/0407 |
| 2019/0103680 A1 * | 4/2019 | Liao ......................... H01L 23/66 |
| 2019/0131690 A1 * | 5/2019 | Lu ............................. H01Q 1/48 |

\* cited by examiner

ANTENNA MODULE

CROSS-REFERENCE TO RELATED APPLICATION(S)

This application claims benefit of priority to Korean Patent Application No. 10-2018-0155754 filed on Dec. 6, 2018 in the Korean Intellectual Property Office, the disclosure of which is incorporated herein by reference in its entirety.

TECHNICAL FIELD

The present disclosure relates to an antenna module in which a semiconductor package and an antenna substrate are coupled to each other.

BACKGROUND

Recently, with the trend of high performance of electronic devices, various components mounted on a mobile device such as a smart phone have been increasing in frequency of use and bandwidth.

In particular, in the case of a millimeter wave/5G antenna module, it is necessary to significantly reduce mutual interference between the components in the antenna module with miniaturization. For example, in a module in which the antenna is integrated with a package including a semiconductor chip (e.g., an RF-IC chip), a method for significantly reducing an influence on radiation patterns of an antenna caused by other components such as a package is required.

SUMMARY

An aspect of the present disclosure may provide an antenna module for reducing an influence on radiation patterns of an antenna.

According to an aspect of the present disclosure, an antenna module may include an antenna substrate having a first surface and a second surface disposed to oppose each other, and including a substrate wiring layer having a first antenna pattern positioned in a first region of the substrate wiring, a second antenna pattern disposed in a second region of the substrate wiring adjacent to one side of the second surface of the antenna substrate, and a first feed pattern and a second feed pattern connected to the first and second antenna patterns, respectively; and a semiconductor package including a connection structure disposed on the second surface except for an area overlapping with the second region of the antenna substrate and having a plurality of insulating layers and redistribution layers disposed on the plurality of insulating layers and electrically connected to the substrate wiring layer, and at least one semiconductor chip having connection pads connected to the redistribution layers. A region overlapping with the second feed pattern in each of the plurality of redistribution layers is provided as an opened region.

According to another aspect of the present disclosure, an antenna module may include an antenna substrate having a first surface and a second surface disposed to oppose each other, and including a substrate wiring layer having an antenna pattern and a feed pattern which are disposed in a region adjacent to at least one side of the second surface; and a semiconductor package including a connection structure disposed on a region of the second surface of the antenna substrate so as not to be overlapped with the antenna pattern and having redistribution layers electrically connected to the substrate wiring layer, and at least one semiconductor chip and passive components having connection pads connected to the redistribution layers. Only an insulating material may be disposed in region in the connection structure overlapping with the feed pattern.

BRIEF DESCRIPTION OF DRAWINGS

The above and other aspects, features and other advantages of the present disclosure will be more clearly understood from the following detailed description taken in conjunction with the accompanying drawings, in which.

DETAILED DESCRIPTION

Hereinafter, exemplary embodiments in the present disclosure will be described with reference to the accompanying drawings. In the accompanying drawings, shapes, sizes, and the like, of components may be exaggerated or shortened for clarity.

Electronic Device

Figure 1:
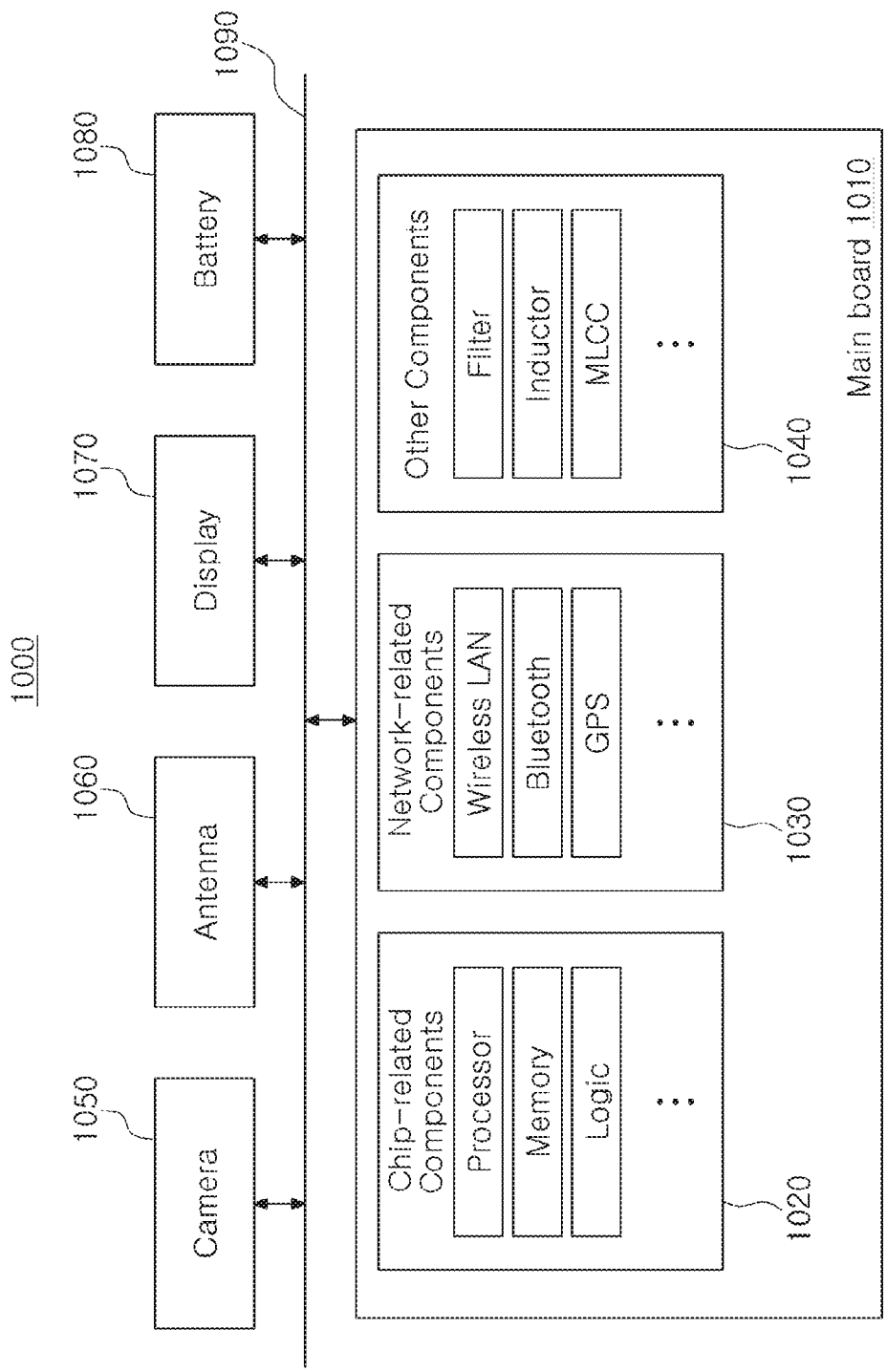
FIG. 1 is a schematic block diagram illustrating an example of an electronic device system.

FIG. 1 is a schematic block diagram illustrating an example of an electronic device system.

Referring to FIG. 1, an electronic device 1000 may accommodate a main board 1010 therein. The main board 1010 may include chip related components 1020, network related components 1030, other components 1040, and the like, physically or electrically connected thereto. These components may be connected to other components, to be described below, to form various signal lines 1090.

The chip related components 1020 may include a memory chip such as a volatile memory (for example, a dynamic random access memory (DRAM)), a non-volatile memory (for example, a read only memory (ROM)), a flash memory, or the like; an application processor chip such as a central processor (for example, a central processing unit (CPU)), a graphics processor (for example, a graphics processing unit (GPU)), a digital signal processor, a cryptographic processor, a microprocessor, a microcontroller, or the like; and a logic chip such as an analog-to-digital (ADC) converter, an application-specific integrated circuit (ASIC), or the like. However, the chip related components 1020 are not limited thereto, and may also include other types of chip related components. In addition, the chip related components 1020 may be combined with each other.

The network related components 1030 may include components implementing protocols such as wireless fidelity (Wi-Fi) (Institute of Electrical And Electronics Engineers (IEEE) 802.11 family, or the like), worldwide interoperability for microwave access (WiMAX) (IEEE 802.16 family, or the like), IEEE 802.20, long term evolution (LTE), evolution data only (Ev-DO), high speed packet access+(HSPA+), high speed downlink packet access+(HSDPA+), high speed uplink packet access+(HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G, and 5G protocols, and any other wireless and wired protocols designated after the abovementioned protocols. However, the network related components 1030 are not limited thereto, and may include a variety of other wireless or wired standards or protocols. In addition, the network related components 1030 may be combined with each other, together with the chip related components 1020 described above.

Other components 1040 may include a high frequency inductor, a ferrite inductor, a power inductor, ferrite beads, a low temperature co-fired ceramic (LTCC), an electromagnetic interference (EMI) filter, a multilayer ceramic capacitor (MLCC), or the like. However, other components 1040 are not limited thereto, and may also include passive components used for various other purposes, or the like. In addition, other components 1040 may be combined with each other, together with the chip related components 1020 or the network related components 1030 described above.

Depending on a type of the electronic device 1000, the electronic device 1000 may include other components that may or may not be physically or electrically connected to the main board 1010. These other components may include, for example, a camera module 1050, an antenna 1060, a display device 1070, a battery 1080, an audio codec (not illustrated), a video codec (not illustrated), a power amplifier (not illustrated), a compass (not illustrated), an accelerometer (not illustrated), a gyroscope (not illustrated), a speaker (not illustrated), a mass storage unit (for example, a hard disk drive) (not illustrated), a compact disk (CD) drive (not illustrated), a digital versatile disk (DVD) drive (not illustrated), or the like. However, these other components are not limited thereto, and may also include other components used for various purposes depending on a type of electronic device 1000, or the like.

The electronic device 1000 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component, or the like. However, the electronic device 1000 is not limited thereto, but may be any other electronic device processing data.

Figure 2:
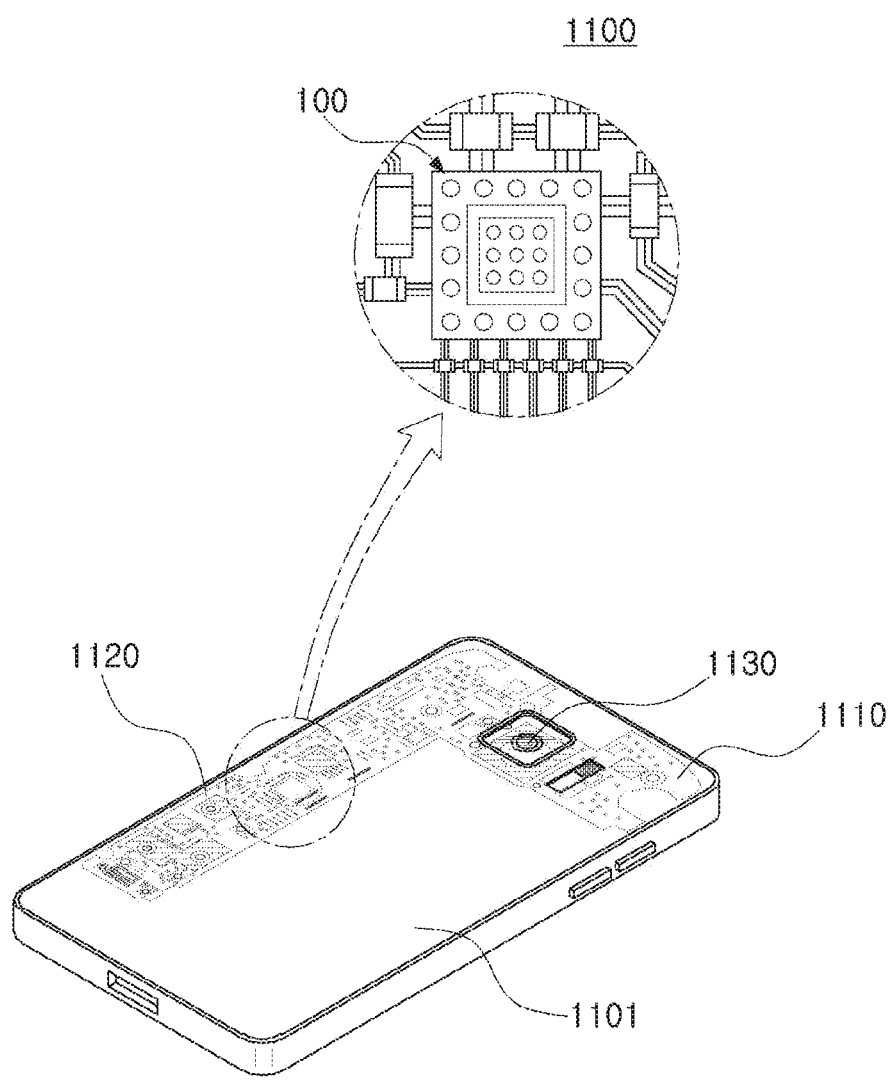
FIG. 2 is a schematic perspective view illustrating an example of an electronic device.

FIG. 2 is a schematic perspective view illustrating an example of an electronic device.

Referring to FIG. 2, a semiconductor package may be used for various purposes in the various electronic devices 1000 as described above. For example, a motherboard 1110 may be accommodated in a body 1101 of a smartphone 1100, and various electronic components 1120 may be physically or electrically connected to the motherboard 1110. In addition, other components that may or may not be physically or electrically connected to the main board 1010, such as a camera module 1130, may be accommodated in the body 1101. Some of the electronic components 1120 may be the chip related components, and the semiconductor package 100 may be, for example, an application processor among the chip related components, but is not limited thereto. The electronic device is not necessarily limited to the smartphone 1100, but may be other electronic devices as described above.

Semiconductor Package

Generally, numerous fine electrical circuits are integrated in a semiconductor chip. However, the semiconductor chip may not serve as a semiconductor finished product in itself, and may be damaged due to external physical or chemical impact. Therefore, the semiconductor chip may not be used by itself, but is instead packaged and used in an electronic device or the like in a package state.

The reason why semiconductor packaging is commonly used is that there is generally a difference in a circuit width between the semiconductor chip and a main board of the electronic device in terms of electrical connection. In detail, a size of connection pads of the semiconductor chip and an interval between the connection pads of the semiconductor chip are very fine, but a size of component mounting pads of the main board used in the electronic device and an interval between the component mounting pads of the main board are significantly larger than those of the semiconductor chip. Therefore, it may be difficult to directly mount the semiconductor chip on the main board, and use of packaging technology for buffering a difference in a circuit width between the semiconductor and the main board is thus advantageous.

A semiconductor package manufactured by the packaging technology may be classified as a fan-in semiconductor package or a fan-out semiconductor package depending on a structure and a purpose thereof.

The fan-in semiconductor package and the fan-out semiconductor package will hereinafter be described in more detail with reference to the drawings.

Fan-In Semiconductor Package

Figure 3B:
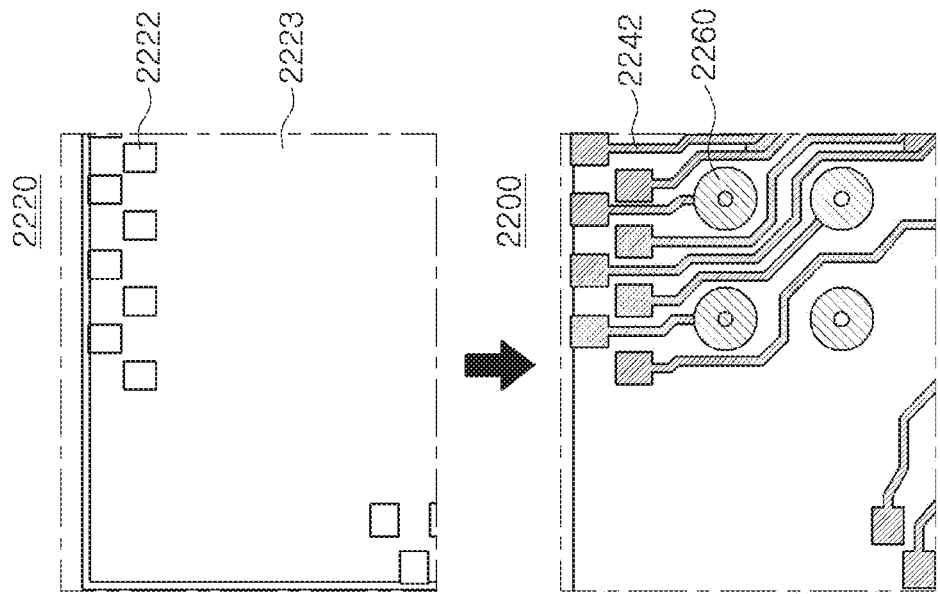
FIGS. 3A and 3B are schematic cross-sectional views illustrating states of a fan-in semiconductor package before and after being packaged.
Figure 3A:
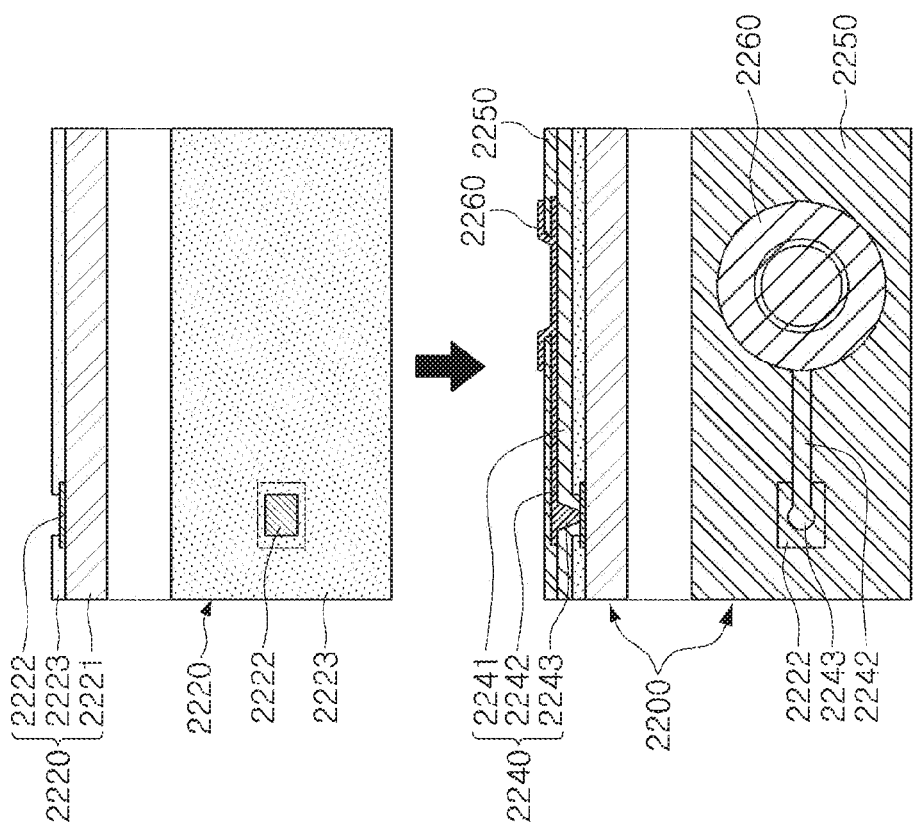
Figure 4:
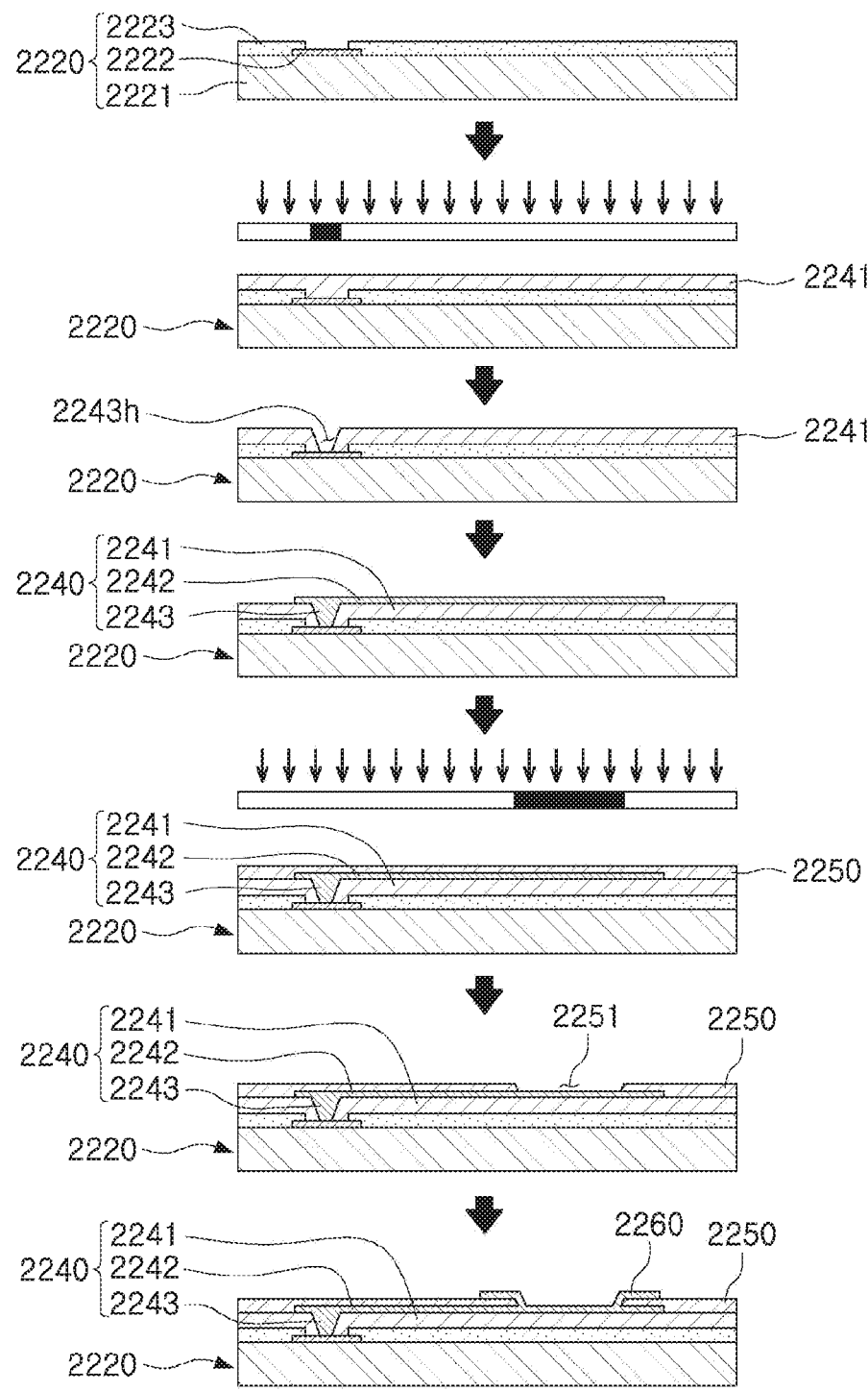
FIG. 4 is a schematic cross-sectional view illustrating a packaging process of a fan-in semiconductor package.

FIGS. 3A and 3B are schematic cross-sectional views illustrating a fan-in semiconductor package before and after being packaged, and FIG. 4 shows a series of schematic cross-sectional views illustrating a packaging process of a fan-in semiconductor package.

Referring to the drawings, a semiconductor chip 2220 may be, for example, an integrated circuit (IC) in a bare state, including a body 2221 including silicon (Si), germanium (Ge), gallium arsenide (GaAs), or the like, connection pads 2222 formed on one surface of the body 2221 and including a conductive material such as aluminum (Al), or the like, and a passivation layer 2223 such as an oxide film, a nitride film, or the like, formed on one surface of the body 2221 and covering at least portions of the connection pads 2222. In this case, since the connection pads 2222 are significantly small, it may be difficult to mount the integrated circuit (IC) on an intermediate level printed circuit board (PCB) as well as on the main board of the electronic device, or the like.

Therefore, depending on a size of the semiconductor chip 2220, a connection member 2240 may be formed on the semiconductor chip 2220 in order to redistribute the connection pads 2222. The connection member 2240 may be formed by forming an insulating layer 2241 on the semiconductor chip 2220 using an insulating material such as a photoimagable dielectric (PID) resin, forming via holes 2243h opening on to the connection pads 2222, and then forming wiring patterns 2242 and vias 2243. Then, a passivation layer 2250 protecting the connection member 2240 may be formed, and an opening 2251 may be formed to have an underbump metal layer 2260, or the like, extending therethrough. That is, a fan-in semiconductor package 2200 including, for example, the semiconductor chip 2220, the connection member 2240, the passivation layer 2250, and the underbump metal layer 2260 may be manufactured through a series of processes.

As described above, the fan-in semiconductor package may have a package form in which all of the connection pads, for example, input/output (I/O) terminals, of the semiconductor chip, are disposed inside the semiconductor chip, and may have excellent electrical characteristics and be produced at a low cost. Therefore, many elements mounted in smartphones have been manufactured in a fan-in semiconductor package form. In detail, many elements mounted in smartphones have been developed to implement a rapid signal transfer while having a compact size.

However, since all I/O terminals generally need to be disposed inside the semiconductor chip in the fan-in semiconductor package, the fan-in semiconductor package has a large spatial limitation. Therefore, it may be difficult to apply this structure to a semiconductor chip having a large number of I/O terminals or a semiconductor chip having a small size. In addition, due to the disadvantages described above, the fan-in semiconductor package may not be directly mounted and used on the main board of the electronic device. The reason is that even in the case that a size of the I/O terminals of the semiconductor chip and an interval between the I/O terminals of the semiconductor chip are increased by a redistribution process, the size of the I/O terminals of the semiconductor chip and the interval between the I/O terminals of the semiconductor chip may not be sufficient to directly mount the fan-in semiconductor package on the main board of the electronic device.

Figure 5:
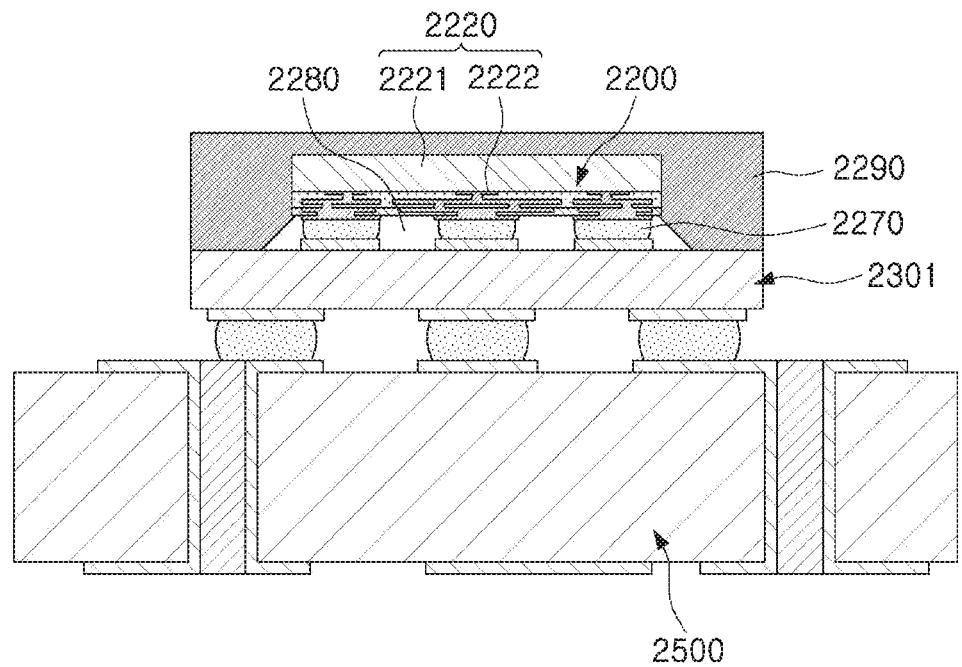
FIG. 5 is a schematic cross-sectional view illustrating a fan-in semiconductor package mounted on an interposer substrate that is ultimately mounted on a main board of an electronic device.
Figure 6:
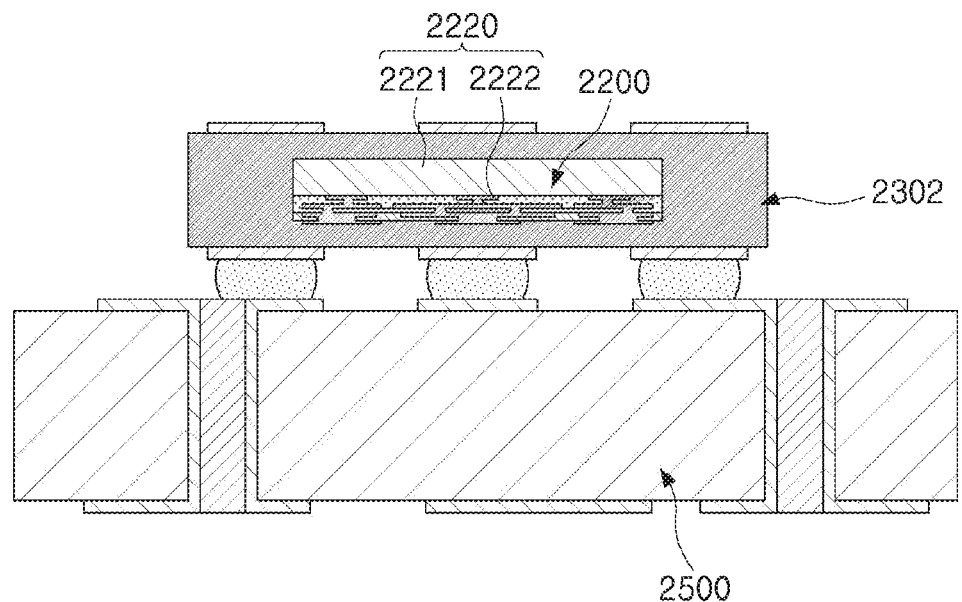
FIG. 6 is a schematic cross-sectional view illustrating a fan-in semiconductor package embedded in an interposer substrate that is ultimately mounted on a main board of an electronic device.

FIG. 5 is a schematic cross-sectional view illustrating a fan-in semiconductor package mounted on an interposer substrate that is ultimately mounted on a main board of an electronic device, and FIG. 6 is a schematic cross-sectional view illustrating a fan-in semiconductor package embedded in an interposer substrate that is ultimately mounted on a main board of an electronic device.

Referring to the drawings, in a fan-in semiconductor package 2200, connection pads 2222, that is, I/O terminals, of a semiconductor chip 2220 may be redistributed once more through an interposer substrate 2301, and the fan-in semiconductor package 2200 may be ultimately mounted on a main board 2500 of an electronic device in a state in which it is mounted on the interposer substrate 2301. In this case, solder balls 2270, and the like, may be fixed by an underfill resin 2280, or the like, and an external surface of the semiconductor chip 2220 may be covered with an encapsulant 2290, or the like. Alternatively, a fan-in semiconductor package 2200 may be embedded in a separate interposer substrate 2302, connection pads 2222, that is, I/O terminals, of a semiconductor chip 2220 may be redistributed once more by the interposer substrate 2302 in a state in which the fan-in semiconductor package 2200 is embedded in the interposer substrate 2302, and the fan-in semiconductor package 2200 may be ultimately mounted on a main board 2500 of an electronic device.

As described above, it may be difficult to directly mount and use the fan-in semiconductor package on the main board (e.g., 2500) of the electronic device. Therefore, the fan-in semiconductor package may be mounted on the separate interposer substrate (e.g., 2301 or 2302) and be then mounted on the main board of the electronic device through a packaging process or may be mounted and used on the main board of the electronic device in a state in which it is embedded in the interposer substrate.

Fan-Out Semiconductor Package

Figure 7:
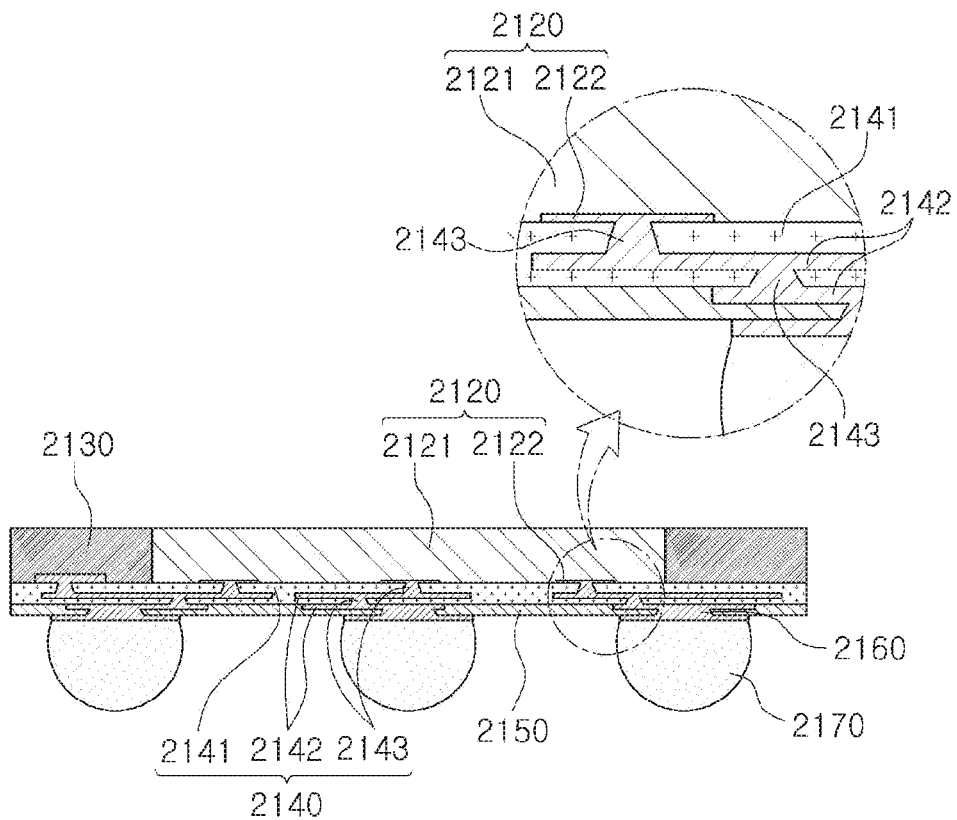
FIG. 7 is a schematic cross-sectional view illustrating a fan-out semiconductor package.

FIG. 7 is a schematic cross-sectional view illustrating a fan-out semiconductor package.

Referring to FIG. 7, in a fan-out semiconductor package 2100, for example, an external surface of a semiconductor chip 2120 may be protected by an encapsulant 2130, and connection pads 2122 of the semiconductor chip 2120 may be redistributed outwardly of the semiconductor chip 2120 by a connection member 2140. In this case, a passivation layer 2150 may be further formed on the connection member 2140, and an underbump metal layer 2160 may be further formed in openings of the passivation layer 2150. Solder balls 2170 may be further formed on the underbump metal layer 2160. The semiconductor chip 2120 may be an integrated circuit (IC) including a body 2121, the connection pads 2122, a passivation layer (not illustrated), and the like. The connection member 2140 may include an insulating layer 2141, redistribution layers 2142 formed on the insulating layer 2141, and vias 2143 electrically connecting the connection pads 2122 and the redistribution layers 2142 to each other.

In the present manufacturing process, the connection member 2140 may be formed after the encapsulant 2130 is formed outside the semiconductor chip 2120. In this case, a process for forming the connection member 2140 is performed to form the via(s) connecting the redistribution layers and the connection pads 2122 of the semiconductor chip 2120 to each other and the redistribution layers 2142, and the vias 2143 may thus have a width reduced toward the semiconductor chip 2120 (see an enlarged region).

As described above, the fan-out semiconductor package may have a form in which I/O terminals of the semiconductor chip are redistributed and disposed outwardly of the semiconductor chip 2120 through the connection member 2140 formed on the semiconductor chip 2120. As described above, in the fan-in semiconductor package, all I/O terminals of the semiconductor chip generally need to be disposed inside the semiconductor chip (e.g., within the footprint of the semiconductor chip on the package). Therefore, when a size of the semiconductor chip is decreased, a size and a pitch of balls generally need to be decreased, such that a standardized ball layout may not be used in the fan-in semiconductor package. On the other hand, the fan-out semiconductor package has the form in which the I/O terminals of the semiconductor chip 2120 are redistributed and disposed outwardly of the semiconductor chip 2120 (e.g., outwardly from the footprint of the semiconductor chip) through the connection member 2140 formed on the semiconductor chip as described above. Therefore, even in the case that a size of the semiconductor chip 2120 is decreased, a standardized ball layout may be used in the fan-out semiconductor package as it is, such that the fan-out semiconductor package may be mounted on the main board of the electronic device without using a separate interposer substrate, as described below.

Figure 8:
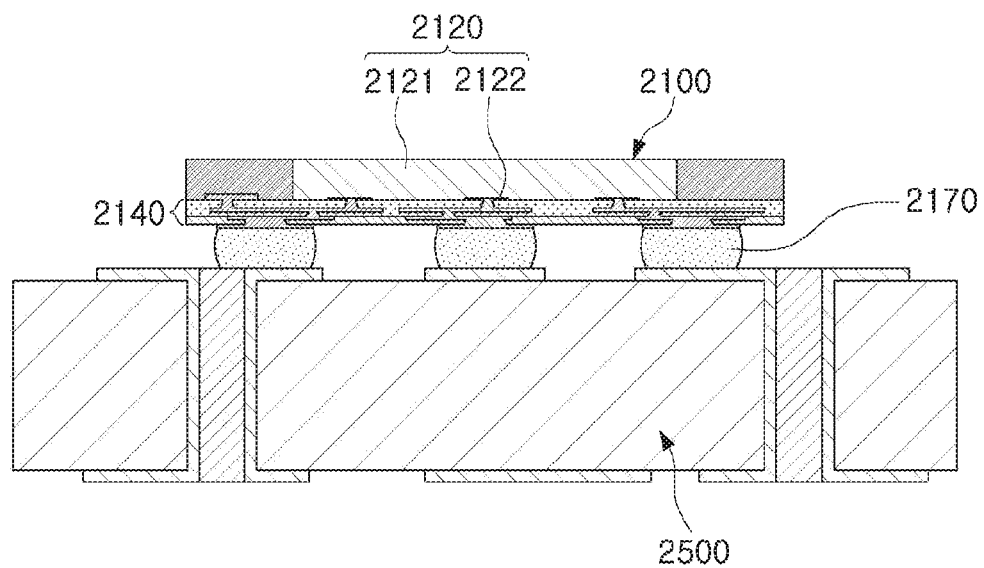
FIG. 8 is a schematic cross-sectional view illustrating a fan-out semiconductor package mounted on a main board of an electronic device.

FIG. 8 is a schematic cross-sectional view illustrating a fan-out semiconductor package mounted on a main board of an electronic device.

Referring to FIG. 8, a fan-out semiconductor package 2100 may be mounted on a main board 2500 of an electronic device through solder balls 2170, or the like. That is, as described above, the fan-out semiconductor package 2100 includes the connection member 2140 formed on the semiconductor chip 2120 and capable of redistributing the connection pads 2122 to a fan-out region that is outside of an area/footprint of the semiconductor chip 2120, such that the standardized ball layout may be used in the fan-out semiconductor package 2100 as it is. As a result, the fan-out semiconductor package 2100 may be mounted on the main board 2500 of the electronic device without using a separate interposer substrate, or the like.

As described above, since the fan-out semiconductor package may be mounted on the main board of the electronic device without using the separate interposer substrate, the fan-out semiconductor package may be implemented at a thickness lower than that of the fan-in semiconductor package using the interposer substrate. Therefore, the fan-out semiconductor package may be miniaturized and thinned. In addition, the fan-out semiconductor package has excellent thermal characteristics and electrical characteristics, such that it is particularly appropriate for a mobile product. Therefore, the fan-out semiconductor package may be implemented in a form more compact than that of a general package-on-package (POP) type using a printed circuit board (PCB), and may solve a problem caused by the occurrence of a warpage phenomenon.

Meanwhile, the fan-out semiconductor package refers to a packaging technology for mounting the semiconductor chip on the main board of the electronic device, or the like, as described above, and protecting the semiconductor chip from external impacts. The fan-out semiconductor package is a concept different from that of a printed circuit board (PCB) such as an interposer substrate, or the like, having a scale, a purpose, and the like, different from those of the fan-out semiconductor package, and having the fan-in semiconductor package embedded therein.

Hereinafter, various exemplary embodiments in the present disclosure will be described in detail with reference to the accompanying drawings.

Figure 9:
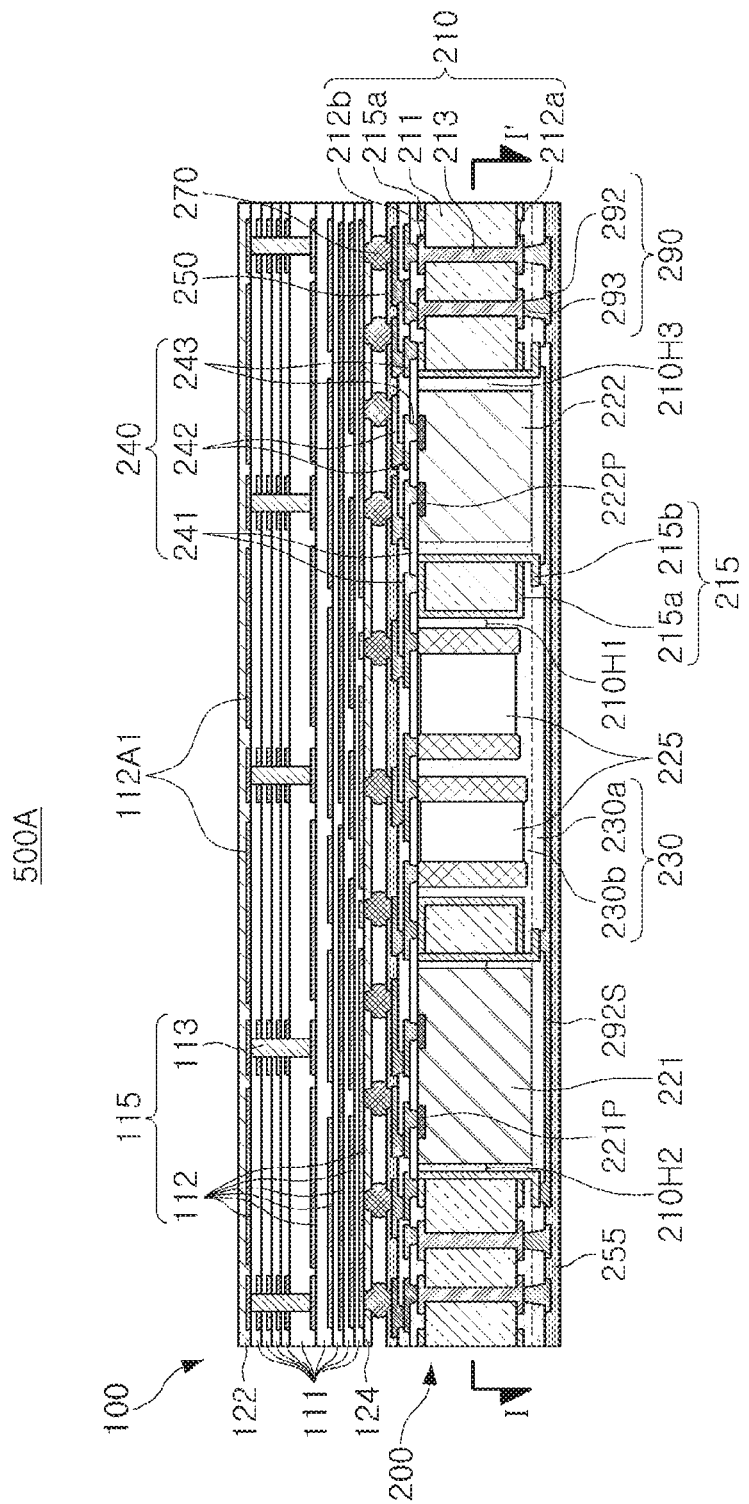
FIG. 9 is a schematic cross-sectional view illustrating an antenna module according to an exemplary embodiment in the present disclosure.
Figure 10:
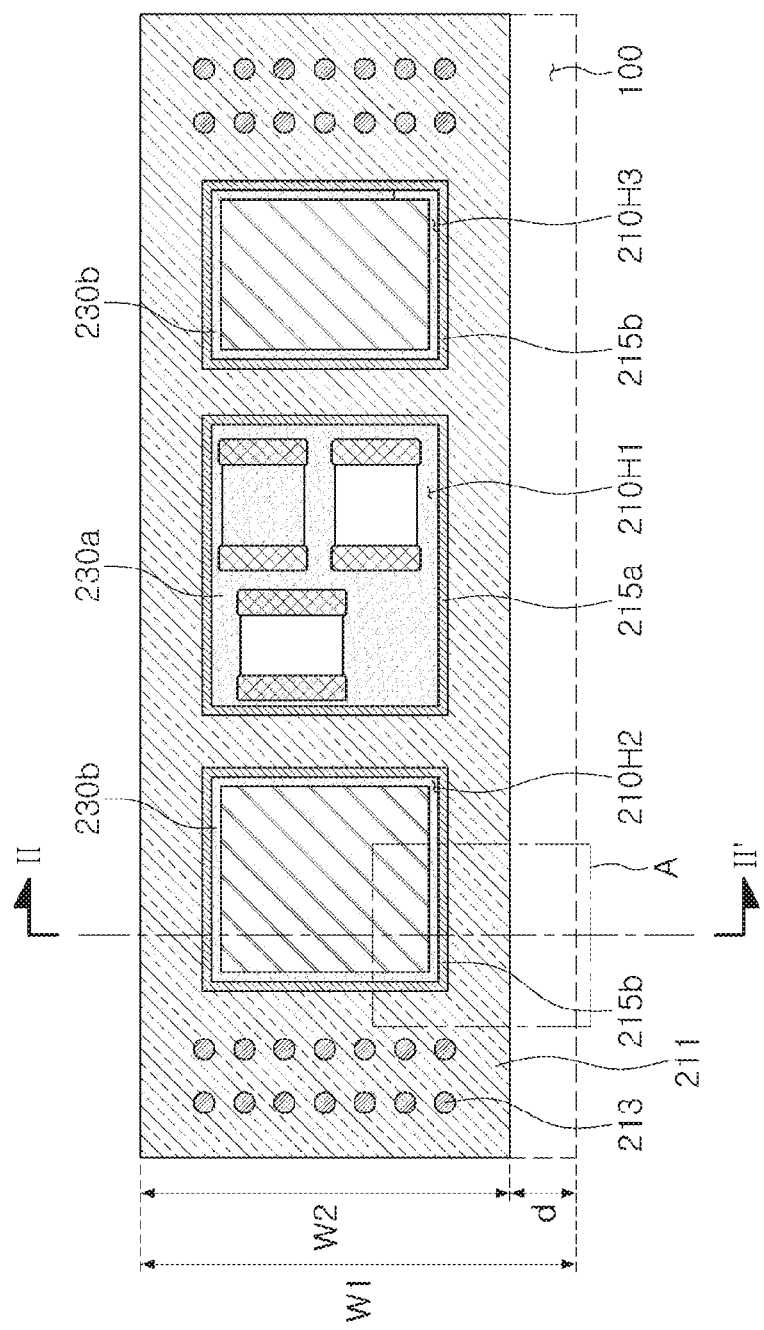
FIG. 10 is a plan view of the antenna module of FIG. 9 taken along line I-I'.
Figure 11:
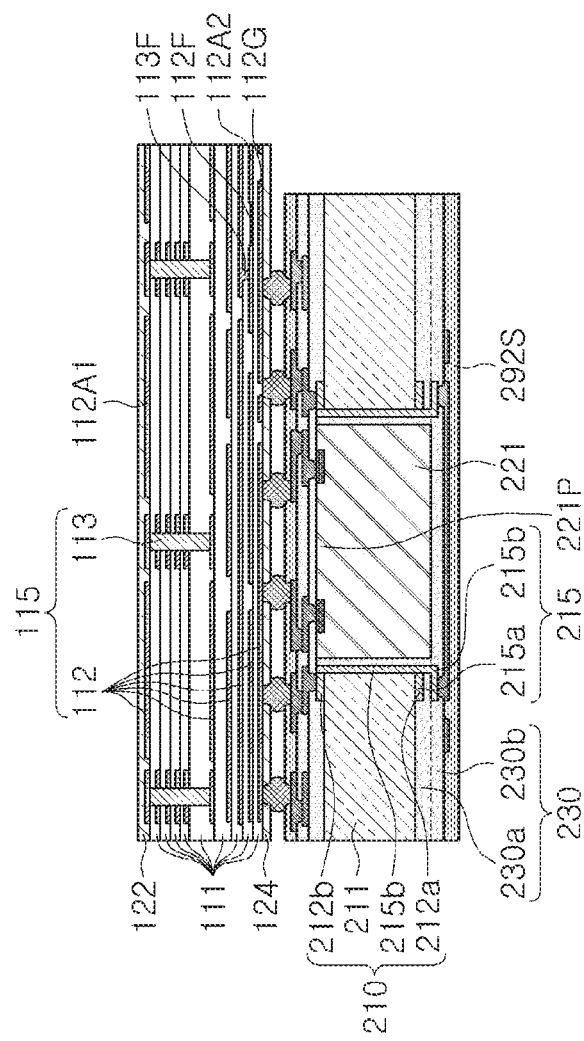
FIG. 11 is a cross-sectional view of the antenna module of FIG. 10 taken along line II-II'.

FIG. 9 is a schematic cross-sectional view illustrating an antenna module according to an exemplary embodiment in the present disclosure, FIG. 10 is a plan view of the antenna module of FIG. 9 taken along line I-I', and FIG. 11 is a cross-sectional view of the antenna module of FIG. 10 taken along line II-II'.

First, referring to FIGS. 9 and 10, an antenna module 500A according to the present exemplary embodiment may include an antenna substrate 100 and a semiconductor package 200 disposed on a lower surface of the antenna substrate 100 and electrically connected to the antenna substrate 100.

The semiconductor package 200 employed in the present exemplary embodiment may include a frame 210 having first to third through-holes 210H1, 210H2, and 210H3 and having a wiring structure 212a, 212b, and 213, a connection structure 240 disposed on an upper surface of the frame 210 and having redistribution layers 242 connected to the wiring structure 212a, 212b, and 213, a plurality of passive components 225 disposed in the first through-hole 210H1 of the frame 210, first and second semiconductor chips 221 and 222 disposed in the second and third through-holes 210H2 and 210H3 of the frame 210, respectively, and an encapsulant 230 encapsulating at least portions of the frame 210, the first and second semiconductor chips 221 and 222, and the passive components 225. Connection pads 221P and 222P of the first and second semiconductor chips 221 and 222, and the plurality of passive components 225 may be each connected to the redistribution layers 242. For example, the first and second semiconductor chips 221 and 222 may include a radio frequency integrated circuit (RFIC) and a power management integrated circuit (PMIC), respectively, and the plurality of passive components 225 may include a capacitor and/or an inductor.

In addition, the semiconductor package 200 may include a backside wiring structure 290 disposed on the lower surface of the frame 210, a passivation layer 250 disposed on the connection structure 240, and electrical connection metals 270 disposed on openings of the passivation layer 250.

The antenna substrate 100 employed in the present exemplary embodiment may be implemented as a millimeter wave/5G antenna. As illustrated in FIG. 9, the antenna substrate 100 may include a substrate insulating layer 111, a substrate wiring layer 112 including first and second antenna patterns 112A1 and 112A2 (shown in FIG. 11) and a ground pattern 112G (shown in FIG. 11), connection vias 113, and substrate passivation layers 122 and 124.

The first and second antenna patterns 112A1 and 112A2 may be antenna elements having different characteristics and functions. For example, the first and second antenna patterns 112A1 and 112A2 may be a patch antenna and a dipole antenna, respectively. In addition, the first and second antenna patterns 112A1 and 112A2 may be disposed at appropriate positions according to respective characteristics. Specifically, as illustrated in FIG. 11, the first antenna pattern 112A1 may be disposed in a region adjacent to an upper surface of the antenna substrate 100, and the second antenna pattern 112A2 may be disposed in a region adjacent to one side of the lower surface of the antenna substrate 100. In addition, the first antenna pattern 112A1 and the second antenna pattern 112A2 may be connected to a first feed pattern (not illustrated) and a second feed pattern 112F to provide a power supplied from the semiconductor package 200.

In general, in the antenna module 500A, since the antenna substrate 100 and the semiconductor package 200 are coupled to each other to be adjacent to each other, a design considering an influence of the semiconductor package 200 on radiation characteristics of the antenna patterns 112A1 and 112A2 may be required.

In the present exemplary embodiment, since the first antenna pattern 112A1 is radiated toward the upper surface of the antenna substrate 100 opposing the semiconductor package 200, an influence of the semiconductor package 200 on the first antenna pattern 112A1 may be relatively small, but since the second antenna pattern 112A2 is positioned in the region adjacent to the side of the lower surface of the antenna substrate 110, the second antenna pattern 112A2 may have a structure which is easily exposed to a negative influence caused by the semiconductor package 200.

Therefore, as illustrated in FIGS. 10 and 11, the semiconductor package 200 may be disposed on the lower surface of the antenna substrate 100 except for one side region of the antenna substrate 100 so as not to be overlapped with one side region of the antenna substrate 100. For example, the semiconductor package 200 may have a width W2 that is smaller than a width W1 of the antenna substrate 100 by a width d of one side region. As described above, the semiconductor package 200 may be designed to be relatively small so as not to affect radiation characteristic and a gain factor of the second antenna pattern 112A2.

The second feed pattern 112F for supplying the power to the second antenna pattern 112A2 as well as the second antenna pattern 112A2 may also be influenced by the semiconductor package 200, in particular, the redistribution layers 242 of the connection structure 240. However, a design considering the second feed pattern 112F is also required, but since a space of the semiconductor package 200 is narrowed when a size of the semiconductor package 200 is further reduced, which is a great limitation on the degree of freedom of design of the semiconductor package 200. For example, since spaces of the first to third through-holes 210H1, 210H2, and 210H3 are narrowed, it may be difficult to dispose the first and second semiconductor chips 221 and 222 and/or the passive components 225.

In the present exemplary embodiment, the influence on the radiation characteristics and the like may be further reduced by not forming the redistribution layers 242 in the region overlapping with the second feed pattern 112F in the connection structure 240 instead of further reducing the size of the semiconductor package 200.

Figure 12A:
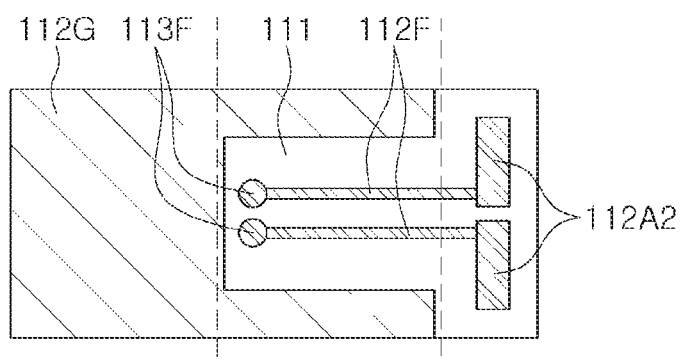
FIGS. 12A and 12B are partial plan views illustrating a specific level (a second antenna pattern and a ground pattern) of an antenna substrate region corresponding to a region "A" of FIG. 10.
Figure 12B:
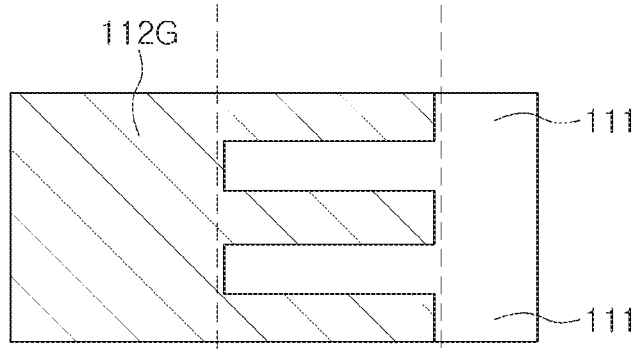
Figure 13:
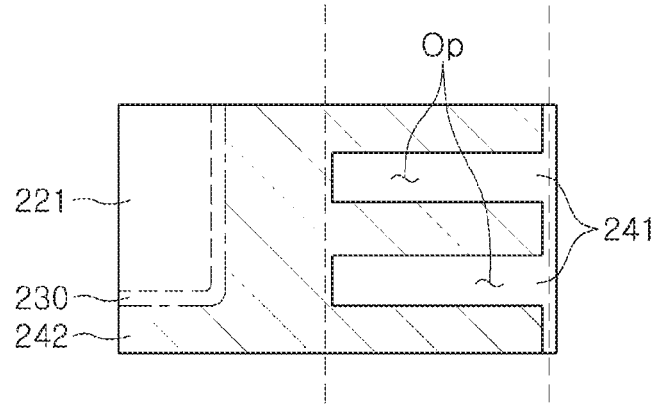
FIG. 13 is a partial plan view illustrating a specific level (a redistribution layer) of a semiconductor package region corresponding to the region "A" of FIG. 10.

Specifically, a design method of the redistribution layer employed in the present exemplary embodiment will be described with reference to FIGS. 12A, 12B, and 13. FIGS. 12A and 12B illustrate a layout of a second antenna pattern level and a ground pattern level of one side region of the antenna substrate 100 corresponding to a region "A" of FIG. 10, and FIG. 13 illustrates a redistribution layer level of a region of the semiconductor package 200 corresponding to the region "A" of FIG. 10.

Referring to FIG. 12A, the second antenna pattern 112A2 may be positioned in a region adjacent to one side of the antenna substrate 100, and may be connected to the second feed pattern 112F connected to another substrate wiring layer 112 by the feeding via 113F. In another insulating layer 111 corresponding to that described above, as illustrated in FIG. 12B, the ground pattern 112G may be disposed in regions except for the region overlapped with the second feed pattern 112F together with one side region in which the second antenna pattern 112A2 is positioned. Such a ground pattern 112G may be disposed between the second antenna pattern 112A2 and the semiconductor package 200.

The redistribution layer 242 may not be formed in the region overlapping with the second feed pattern 112F in the connection structure 240 corresponding to the region "A". Conductive patterns constituting the redistribution layers 242 positioned on the respective insulating layers 241 of the connection structure 240 may have opened region (Op) in which the conductive patterns are removed from the regions overlapping with the second feed pattern 112F and portions corresponding to the insulating layer 241 are exposed, as illustrated in FIG. 13.

When the connection structure 240 includes a plurality of insulating layers 241, each redistribution layer 242 may have the opened region (Op) overlapping with the second feed pattern 112F. In addition, only the redistribution layers 242 are mentioned, but redistribution vias 243 may also not be disposed in the overlapped region.

As described above, the influence on the radiation characteristics and the like may be further reduced and the degree of freedom of design of the semiconductor package 200 may be sufficiently maintained by employing the opened regions (Op) in which the redistribution layers 242 are not formed in the region overlapping with the second feed pattern 112F in the connection structure 240 instead of further reducing the size of the semiconductor package 200.

Although it is illustrated that the antenna substrate 100 employed in the present exemplary embodiment includes the first and second antenna patterns 112A1 and 112A2 of different radiation characteristics and the second antenna pattern 112A2 is disposed in the region adjacent to one side of the lower surface of the substrate, the antenna substrate 100 may have various other arrangements. For example, the second antenna pattern 112A2 may be further disposed in other side regions adjacent to one side region.

Figure 14:
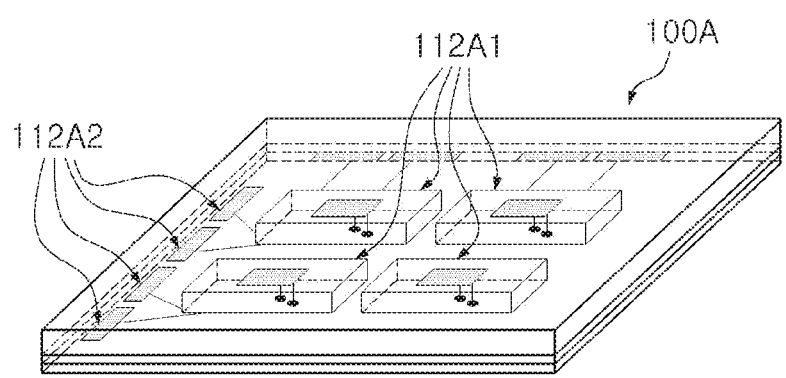
FIG. 14 is a schematic perspective view illustrating another example of an antenna substrate applied to the antenna module of FIG. 9.

In an antenna substrate 100A illustrated in FIG. 14, a plurality of first antenna patterns 112A1 may be disposed on an upper surface of the substrate 100A as patch antennas, and a plurality of second antenna patterns 112A2 may be arranged along two adjacent sides as dipole antennas. In this case, the semiconductor package 200 may be formed in a size that does not overlap with the dipole antennas in the two adjacent side regions, and the redistribution layers may be designed to have the opened regions in which the conductive patterns are removed from the regions overlapping with the feeding lines associated with the respective dipole antennas.

In addition, the present exemplary embodiment illustrates the antenna substrate including the plurality of antenna patterns, but is not limited thereto. Even in a case in which the antenna substrate includes a single antenna pattern, the redistribution layers 242 of the semiconductor package 200 may include an additional opened region (Op) in a region overlapping with the antenna pattern so that the antenna pattern is disposed in the region adjacent to the semiconductor package 200 (e.g., the side region adjacent to the lower surface of the antenna substrate) and significantly reduces an influence caused by the conductor element of the semiconductor package.

Recently, with the trend of high performance of electronic devices, various components mounted on a mobile device such as a smart phone have been increasing in frequency of use and bandwidth. In particular, in the case of the mm-Wave and 5G antenna module, an electro-magnetic interference (EMI) structure is required between mounting components such as the first and second semiconductor chips 221 and 222 using high frequencies.

A metal layer 215 may be disposed on side walls of the first to third through-holes 210H1, 210H2, and 210H3. The metal layer 215 may be formed on an inner side wall of each of the first to through through-holes 210H1, 210H2, and 210H3 to surround the first and second semiconductor chips 221 and 222 and the passive components 225, and may be connected to a ground through the redistribution layers 242, or the like to enhance an electro-magnetic interference effect and to improve heat dissipation characteristics.

In addition, backside metal layers 292S, which are portion of the backside wiring structure 290, may be disposed on inactive surfaces of the first and second semiconductor chips 221 and 222, such that shielding structures formed on the side surfaces and the lower surfaces of the first and second semiconductor chips 221 and 222 may be provided. In this case, the backside vias 293 connected to the backside metal layers 292S may be line vias of a line shape. By forming the backside vias 293 in the form of a trench provided together with such backside metal layers 292S, the EMI for the first and second semiconductor chips 221 and 222 may be further enhanced.

Hereinafter, the respective components included in the semiconductor module 500A according to the present exemplary embodiment will be described in more detail.

An insulating material may be used as a material of the substrate insulating layer 111. In this case, the insulating material may be a thermosetting resin such as an epoxy resin, a thermoplastic resin such as polyimide, a material including a reinforcing material such as inorganic filler together with the thermosetting resin and the thermoplastic resin, for example, Ajinomoto build-up film (ABF), or the like. However, the material of the substrate insulating layer 111 is not limited, but a photoimagable dielectric (PID), or the like may also be used. Even in a case in which the materials of the respective layers of the substrate insulating layer 111 are the same, a boundary therebetween may be apparent.

The substrate wiring layer 112 may include the first and second antenna patterns 112A1 and 112A2 implementing the millimeter wave/5G antenna, as described above, and may further include the ground pattern 112G, the feed pattern 112F, and the like. The ground pattern 112G may have a form of a ground plane. The antenna pattern may be surrounded by the ground pattern disposed at the same level, but is not limited thereto. The substrate wiring layer 112 may include other signal patterns, power patterns, or resistance patterns. A material of the substrate wiring layer 112 may be a conductive material such as copper (Cu), aluminum (Al), silver (Ag), tin (Sn), gold (Au), nickel (Ni), lead (Pb), titanium (Ti), or alloys thereof, but is not limited thereto.

The connection vias 113 may electrically connect the substrate wiring layers 112 formed on different layers to each other, resulting in an electrical path in the antenna substrate 100. The connection vias 113 may include the feeding vias 113F electrically and/or signally connected to the first and second antenna patterns 112A1 and 112A2, and may include other ground connection vias, or the like. The connection vias 113 may include other signal connection vias, power connection vias, or the like. Some of the ground connection vias may surround the feeding vias. A material of each of the connection vias 113 may be a conductive material such as copper (Cu), aluminum (Al), silver (Ag), tin (Sn), gold (Au), nickel (Ni), lead (Pb), titanium (Ti), or alloys thereof. Each of the connection vias 113 may be completely filled with the conductive material, or the conductive material may be formed along a wall of each of via holes unlike illustrated in the drawings. In addition, each of the connection vias 113 may have all of the known vertical cross-sectional shapes such as a cylindrical shape, an hourglass shape, a tapered shape, or the like.

According to an exemplary embodiment, the antenna substrate 100 may include a core layer, and the substrate insulating layer 111 may be built-up on both sides in relation to the core layer. In this case, an insulating material may be used as a material of the core layer. The insulating material may be a thermosetting resin such as an epoxy resin, a thermoplastic resin such as polyimide, a material including a reinforcing material such as a glass fiber (a glass cloth or a glass fabric) and/or inorganic filler together with the thermosetting resin and the thermoplastic resin, for example, prepreg. However, the material of the core layer is not limited to the resin material. For example, the material of the core layer may be a glass plate and a ceramic plate.

The substrate passivation layers 122 and 124 may be disposed on the upper and lower surfaces of the antenna substrate 100 to protect the components within the antenna substrate 100. The substrate passivation layers 122 and 124 may also include an insulating material, for example, ABF, but are not limited thereto.

Since the frame 210 includes the insulating layer 211 and the wiring structure 212a, 212b, and 213, the number of layers of the connection structure 240 may be reduced. In addition, the frame 210 may improve rigidity of the semiconductor package 200A depending on certain materials, and serve to secure uniformity of a thickness of the encapsulant 230. The frame 210 may have one or more through-holes 210H1, 210H2, and 210H3. The first to third through-holes 210H1, 210H2, and 210H3 may be disposed to be spaced apart from each other. As illustrated in FIG. 10, the first and second semiconductor chips 221 and 222 and the passive components 225 may be disposed to be spaced apart from walls of the first to third through-holes 210H1, 210H2, and 210H3 by a predetermined distance, and may be surrounded by the walls of the first to third through-holes 210H1, 210H2, and 210H3, but are limited thereto.

In the present exemplary embodiment, the first through-hole 210H1 may be formed before the second and third through-holes 210H2 and 210H3. Specifically, the first through-hole 210H1 may be formed at a frame level (see FIG. 15A), and the first through-hole 210H1 may be first mounted with the passive component 225 and may be encapsulated by the first encapsulant 230a (see FIGS. 15B and 15C). On the other hand, the second and third through-holes 210H2 and 210H3 may be formed after the first encapsulant 230a is applied, and the second and third through-holes 210H2 and 210H3 may be disposed with the first and second semiconductor chips 221 and 222 and may be encapsulated by the second encapsulant 230b.

The wiring structure of the frame 210 may include the first and second wiring patterns 212a and 212b disposed on opposite surfaces of the insulating layer 211, and the wiring via 213 penetrating through the insulating layer 211 and connecting the first and second wiring patterns 212a and 212b to each other. The second wiring pattern 212b may be connected to the redistribution layer 242.

The first and second wiring patterns 212a and 212b may serve to redistribute the connection pads 221P and 222P of the first and second semiconductor chips 221 and 222. In addition, the first and second wiring patterns 212a and 212b may be used as vertical connection means electrically connecting other upper and lower components to each other together with the wiring via 213. For example, the first and second wiring patterns 212a and 212b and the wiring via may include a conductive material such as copper (Cu), aluminum (Al), silver (Ag), tin (Sn), gold (Au), nickel (Ni), lead (Pb), titanium (Ti), or alloys thereof.

An insulating material may be used as the material of the insulating layer 211. In this case, the insulating material may be a thermosetting resin such as an epoxy resin, a thermoplastic resin such as polyimide, an insulating material in which the thermosetting resin and the thermoplastic resin are impregnated in a core material such as inorganic filler and/or a glass fiber (a glass cloth or a glass fabric), for example, prepreg, Ajinomoto Build-up Film (ABF), FR-4, Bismaleimide Triazine (BT), or the like, but is not limited thereto. For example, as the material of the insulating layer 211, glass or ceramic-based insulating materials may be applied to required material properties.

In addition, the frame 210 may include a metal layer 215 disposed on inner side walls of the through-holes 210H1, 210H2, and 210H3, and the metal layer 215 may be connected to the redistribution layer 242 (e.g., the ground pattern). As described above, the metal layer 215 may be used as the heat dissipation means as well as the EMI shielding means.

In the present exemplary embodiment, the metal layer 215 disposed in the first through-hole 210H1 may include a first metal layer 215a disposed on an inner side wall of the frame 210 and the upper and lower surfaces of the frame 210 adjacent to the inner side wall of the frame 210. The metal layer 215 disposed in the second and third through-holes 210H2 and 210H3 may include a first metal layer 215a disposed on an upper surface or a lower surface adjacent to the inner side wall of the frame 210, and the second metal layer 215b disposed on an upper surface of the first encapsulant 230a adjacent to the inner side wall formed along the first encapsulant 230a and the frame 210. The second metal layer 215b may be connected to the first metal layer 215a at the inner side walls of the second and third through-holes 210H2 and 210H3. For example, the metal layer 215 may include a conductive material such as copper (Cu), aluminum (Al), silver (Ag), tin (Sn), gold (Au), nickel (Ni), lead (Pb), titanium (Ti), or alloys thereof. The metal layer 215 may be formed by a known plating process, and may include a seed layer and a conductor layer. The metal layer 215 may also be used as a ground. In this case, the metal layer 215 may be electrically connected to the ground patterns of the redistribution layers 242 of the connection structure 240.

The semiconductor chips 221 and 222 may include a first semiconductor chip 221 and a second semiconductor chip 222 that perform different functions. In the present exemplary embodiment, the first semiconductor chip 221 may be a power management integrated chip (PMIC) and the second semiconductor chip 222 may be a radio frequency integrated circuit (RFIC), which may be electrically connected to each other. The first semiconductor chip 221 may be mounted in the second through-hole 210H2, and the second semiconductor chip 222 may be mounted in the third through-hole 210H3 disposed to be spaced apart from the second through-hole 210H2.

The first and second semiconductor chips 221 and 222 may have active surfaces on which the connection pads 221P and 222P are disposed, and inactive surfaces opposing the active surfaces. The first and second semiconductor chips 221 and 222 may be formed on the basis of an active wafer. In this case, a base material may be silicon (Si), germanium (Ge), gallium arsenide (GaAs), or the like. The connection pads 221P and 222P may electrically connect the first and second semiconductor chips 221 and 222 to other components, and a conductive material such as aluminum (Al), or the like, may be used as a material of each of the connection pads 221P and 222P without being particularly limited. The first and second semiconductor chips 221 and 222 may be electrically connected to the antenna substrate 100 and the passive components 225 through the connection pads 221P and 222P, the connection structure 240, or the like. The number and arrangement form of the first and second semiconductor chips 221 and 222 mounted in the antenna substrate 100 may be variously changed in the exemplary embodiments.

The passive components 225 may be disposed in the first through-hole 210H1. The passive components 225 may be capacitors, inductors, or the like. The passive components 225 may be electrically connected to the semiconductor chips 221 and 222, respectively, through the connection structure 240. The number and arrangement form of the passive components 225 mounted in the semiconductor package 200 may be variously changed in the exemplary embodiments. In other exemplary embodiments, the passive components 225 may be separately disposed in two or more through-holes, or may be disposed together with the semiconductor chips 221 and 222 in the second and third through-holes 210H2 and 210H3.

The encapsulant 230 may include the first encapsulant 230a encapsulating the passive components 225 disposed in the first through-hole 210H1, and the second encapsulant 230b encapsulating the first encapsulant 230a and the first and second semiconductor chips 221 and 222 disposed in the second and third through-holes 210H2 and 210H3, respectively, as described above. The first and second encapsulants 230a and 230b may fill at least portions of the first through-hole 210H1 and the second and third through-holes 210H2 and 210H3, respectively, and may encapsulate the passive components 225 and the first and second semiconductor chips 221 and 222, respectively. The first and second encapsulants 230a and 230b may have various encapsulated forms. For example, the first encapsulant 230a may cover one surface of the frame 210 as well as the passive components 225. In addition, the second encapsulant 230b may cover the side surfaces and the inactive surface of each of the first and second semiconductor chips 221 and 222, and may cover a portion of the first encapsulant 230a positioned on one surface of the frame 210. A certain material of each of the first and second encapsulants 230a and 230b is not particularly limited, but may be an insulating material such as ABF, or the like. Alternatively, a photoimagable encapsulant (PIE) may be used. The first and second encapsulants 230a and 230b may use the same material, and may also use different insulating materials, if necessary. Even in the case in which the first and second encapsulants 230a and 230b use the same material, a boundary between the first and second encapsulants 230a and 230b may be visually observed due to a difference in a cured point of time.

The connection structure 240 may redistribute the connection pads 221P and 222P of the first and second semiconductor chips 221 and 222. Several tens to several hundreds of connection pads 221P and 222P of the first and second semiconductor chips 221 and 222 having various functions may be redistributed by the connection structure 240. In addition, the connection structure 240 may electrically connect the connection pads 221P and 222P of the semiconductor chips 221 and 222 to the passive components 225. In addition, the connection structure 240 may provide electrical connection paths with the antenna substrate 100. The connection structure 240 may include an insulating layer 241, redistribution layers 242 disposed on the insulating layer 241, and redistribution vias 243 penetrating through the insulating layer 241 and connected to the redistribution layers 242. The connection structure 240 may be formed of a single layer, or may be designed with a number of layers greater than the number of illustrated layers (e.g., two layers).

An insulating material may be used as a material of the insulating layer 241 of the connection structure 240. In this case, in addition to the insulating material as described above, a photosensitive insulating material such as a PID resin may also be used as the insulating material. The redistribution layers 242 may serve to substantially redistribute the connection pads 221P and 222P. A material of each of the redistribution layers 242 may be a conductive material such as copper (Cu), aluminum (Al), silver (Ag), tin (Sn), gold (Au), nickel (Ni), lead (Pb), titanium (Ti), or alloys thereof. The redistribution layers 242 may perform various functions depending on designs of a corresponding layer. For example, the redistribution layers 242 may include ground (GND) patterns, power (PWR) patterns, signal (S) patterns, and the like. Here, the signal (S) patterns may include various signals except for the ground (GND) patterns, the power (PWR) patterns, and the like, such as data signals, and the like. In addition, the redistribution layers 242 may include via pads, and the like. The redistribution layers 242 may also include feed patterns.

The redistribution vias 243 may electrically connect the redistribution layers 243, the connection pads 221P and 222P, the passive components 225, or the like, formed on different layers to each other, resulting in electrical paths between the antenna substrate 100 and other components. A material of each of the redistribution vias 243 may be a conductive material such as copper (Cu), aluminum (Al), silver (Ag), tin (Sn), gold (Au), nickel (Ni), lead (Pb), titanium (Ti), or alloys thereof. Each of the redistribution vias 243 may be completely filled with the conductive material, or the conductive material may be formed along a wall of each of the vias. In addition, each of the redistribution vias 243 may have a tapered shape in a direction opposite to that of each of the backside vias 293.

The passivation layer 250 having an opening exposing at least a portion of each of the redistribution layers 242 may be disposed on an upper surface of each of the connection structure 240. The passivation layer 250 may protect the connection structure 240 from external physical or chemical damage. The passivation layer 250 may include an insulating resin and inorganic filler, but may not include a glass fiber. For example, the passivation layer 250 may be formed of an ABF, but is not limited thereto, and may also be formed of a PID, a solder resist, or the like. A plurality of electrical connection metals 270 electrically connected to the exposed redistribution layers 242 may be disposed on the openings of the passivation layer 250. The electrical connection metals 270 may be configured to physically and/or electrically connect the semiconductor package 200 to the antenna substrate 100. Each of the electrical connection metals 270 may be formed of a low melting point metal, for example, tin (Sn) or an alloy including tin (Sn), more specifically, a solder, or the like. However, this is merely an example, and a material of each of the electrical connection metal 270 is not particularly limited thereto. Each of the electrical connection metals 270 may be a land, a ball, a pin, or the like. The electrical connection metals 270 may be formed as a multilayer or single layer structure. When the electrical connection metals 270 are formed as a multilayer structure, the electrical connection metals 270 may include a copper (Cu) pillar and a solder. When the electrical connection metals 270 are formed as a single layer structure, the electrical connection metals 270 may include a tin-silver solder or copper (Cu). However, this is merely an example, and a material of each of the electrical connection metals 270 is not limited thereto. The number, interval, disposition form, and the like, of the electrical connection metals 270 are not particularly limited, but may be sufficiently modified depending on design particulars by those skilled in the art.

At least one of the electrical connection metals 270 may be disposed in a fan-out region. The fan-out region is a region except for regions in which the semiconductor chips 221 and 222 are disposed. The fan-out package may have reliability greater than that of a fan-in package, may implement a plurality of I/O terminals, and may easily perform 3D interconnection. In addition, as compared to a ball grid array (BGA) package, a land grid array (LGA) package, or the like, the package may be manufactured to have a small thickness, and may have price competitiveness.

The backside wiring structure 290 including backside wiring layers 292 and backside vias 293 may be disposed on a lower surface of the encapsulant 230. The backside wiring layers 292 may be connected to the wiring layer 212 and the metal layer 215 of the frame 210 through the backside vias 293 penetrating through the encapsulant 230. A material of each of the backside wiring layers 292 and the backside vias 293 may be a conductive material such as copper (Cu), aluminum (Al), silver (Ag), tin (Sn), gold (Au), nickel (Ni), lead (Pb), titanium (Ti), or alloys thereof. The backside wiring layers 292 may include signal patterns, signal via pads, or the like. A backside metal layer 292S, which is a portion of the backside wiring layers 292, may cover the inactive surfaces of the semiconductor chips 221 and 222, and may be connected to the wiring layer 212 of the frame 210 through the backside vias 293, thereby implementing an excellent heat dissipation effect and an excellent electromagnetic wave shielding effect. The backside metal layer 292S may also be connected to the ground patterns and/or the power patterns of the wiring layer such as the wiring layer 212a and the wiring layer 212b of the frame 210 and may be used as the ground. In some exemplary embodiments, openings exposing some of the backside wiring layers 292 may be formed in the backside wiring structure 290. In this case, connection structure such as the electrical connection metals 270 may be disposed in the openings, such that the antenna module 500A may be mounted on an external device such as a board. The backside passivation layer 255 may be formed to cover the backside wiring structure 290 including the backside wiring layers 292 and the backside vias 293. The backside passivation layer 255 may include a material that is the same as or similar to that of the passivation layer 250 described above.

FIGS. 15A through 15F are cross-sectional views for describing main processes of a method of manufacturing an antenna module according to an exemplary embodiment in the present disclosure.

Figure 15A:
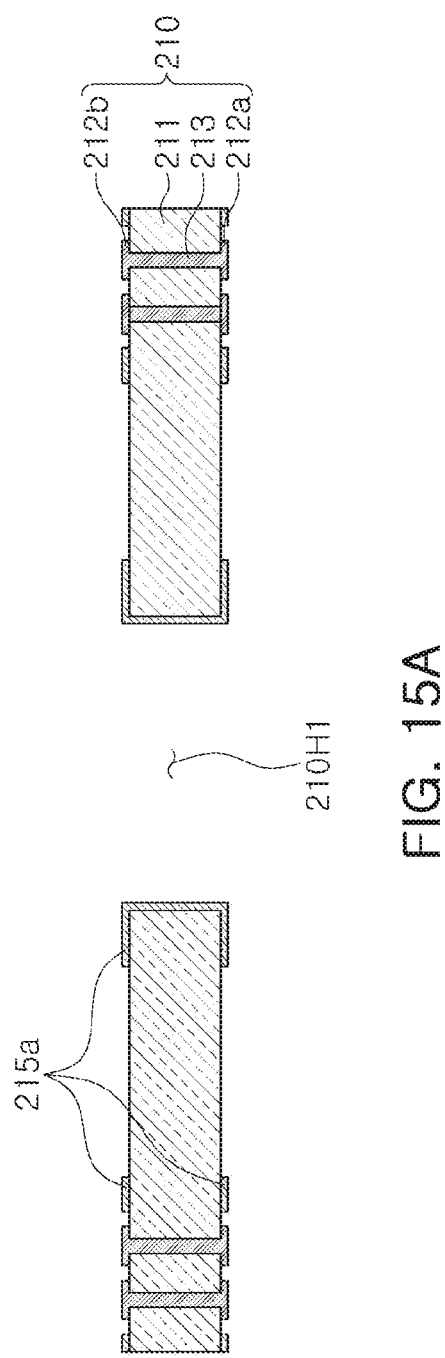
FIGS. 15A through 15F are cross-sectional views for describing main processes of a method of manufacturing an antenna module according to an exemplary embodiment in the present disclosure.

Referring to FIG. 15A, a frame 210 having a wiring structure 212a, 212b, and 213 connecting upper and lower surfaces of the frame 210 to each other may be prepared, and a first through-hole 210H1 penetrating through the upper and lower surfaces of the frame 210 may be formed in the frame 210.

In the present process, the first through-hole 210H1 may be formed by using a mechanical drill and/or a laser drill. However, a method of forming the first through-hole 210H1 is not limited thereto, and the first through-hole 210H1 may also be formed by a sand blast method using particles for polishing, a dry etching method using plasma, or the like, according to a material of an insulating layer 211. The first through-hole 210H1 may be provided as a space in which passive components are to be mounted rather than the first and second semiconductor chips.

A first metal layer 215a may be formed on an inner side wall of the first through-hole 210H1, and may be additionally formed on some regions of the upper and lower surfaces of the frame 210. The first metal layer 215a may be formed by a plating process, and may include a seed layer and a conductor layer. The first metal layer 215a may be formed together with the first and second wiring patterns 212a and 212b of the frame 210. The first metal layer 215a may be connected to the wiring structure on the upper and lower surfaces of the frame 210. For example, the first metal layer 215a may include a conductive material such as copper (Cu), aluminum (Al), silver (Ag), tin (Sn), gold (Au), nickel (Ni), lead (Pb), titanium (Ti), or alloys thereof.

Figure 15B:
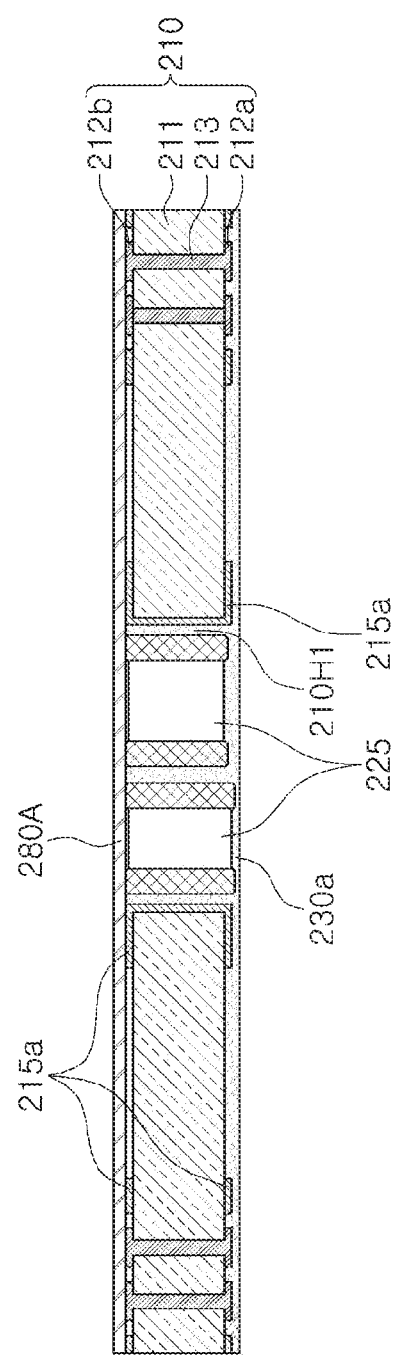

Referring to FIG. 15B, a first adhesive film 280A may be attached to the lower surface of the frame 210, and the passive components 225 may be disposed in the first through-hole 210H1 and may be encapsulated by using a first encapsulant 230a.

Any material that may fix the frame 210 may be used as the first adhesive film 280A. As a non-restrictive example of such a material, the known tape, or the like, may be used. An example of the known tape may include a heat treatment-curable adhesive tape of which adhesion is weakened by heat treatment, an ultraviolet-curable adhesive tape of which adhesion is weakened by ultraviolet ray irradiation, or the like. For example, the passive components 225 may include capacitors and/or inductors. In the present exemplary embodiment, the first encapsulant 230a may encapsulate the passive components 225 in the first through-hole 210H1 and cover the upper surface of the frame 210.

Figure 15C:
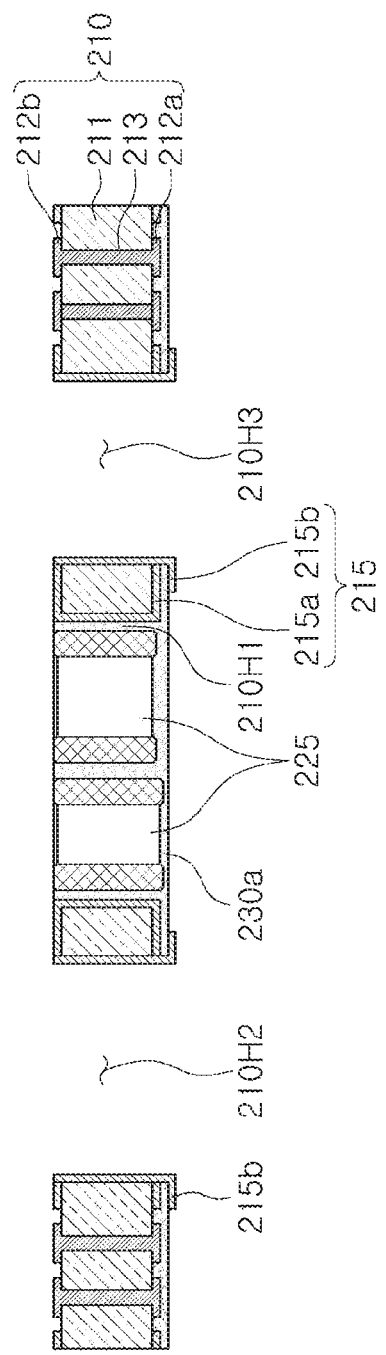

Referring to FIG. 15C, second and third through-holes 210H2 and 210H3 penetrating through the upper and lower surfaces of the frame 210 may be formed.

The present process may be performed by removing the first adhesive film 280A from the lower surface of the frame 210. The second and third through-holes 210H2 and 210H3 may be formed by using a mechanical drill and/or a laser drill. However, a method of forming the second and third through-holes 210H2 and 210H3 is not limited thereto, and the second and third through-holes 210H2 and 210H3 may also be formed by a sand blast method, a dry etching method, or the like, according to the materials of the insulating layer 211 and the first encapsulant 230a. The second and third through-holes 210H2 and 210H3 may be provided as mounting spaces for the first and second semiconductor chips. Other passive components may be additionally mounted, if necessary.

A second metal layer 215b may be formed on an inner side wall of each of the second and third through-holes 210H2 and 210H3, and the second metal layer 215b may be formed to be partially extended to the upper surface region of the first encapsulant 230a. The second metal layer 215b may be formed by a plating process similarly to the first metal layer 215a. The second metal layer 215b may be connected to the first metal layer 215a at the inner side walls of the second and third through-holes 210H2 and 210H3. For example, the second metal layer 215b may include a conductive material such as copper (Cu), aluminum (Al), silver (Ag), tin (Sn), gold (Au), nickel (Ni), lead (Pb), titanium (Ti), or alloys thereof.

Figure 15D:
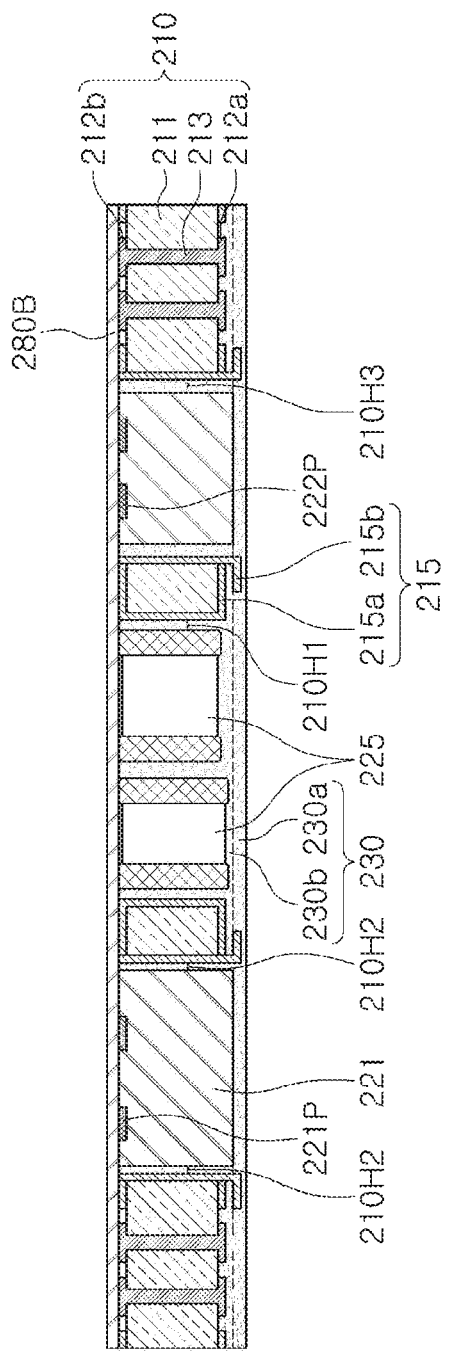

Referring to FIG. 15D, a second adhesive film 280B may be attached to the lower surface of the frame 210, and the first and second semiconductor chips 221 and 222 may be disposed in the second and third through-holes 210H2 and 210H3, respectively, and may be encapsulated by using a second encapsulant 230b.

Any material that may fix the frame 210 may be used as the second adhesive film 280B similarly to the first adhesive film 280A, and a known tape, or the like, may be used. The second encapsulant 230b may cover the first and second semiconductor chips 221 and 222 disposed in the second and third through-holes 210H2 and 210H3, respectively, and may be formed on the first encapsulant 230a covering the upper surface of the frame 210.

Figure 15E:
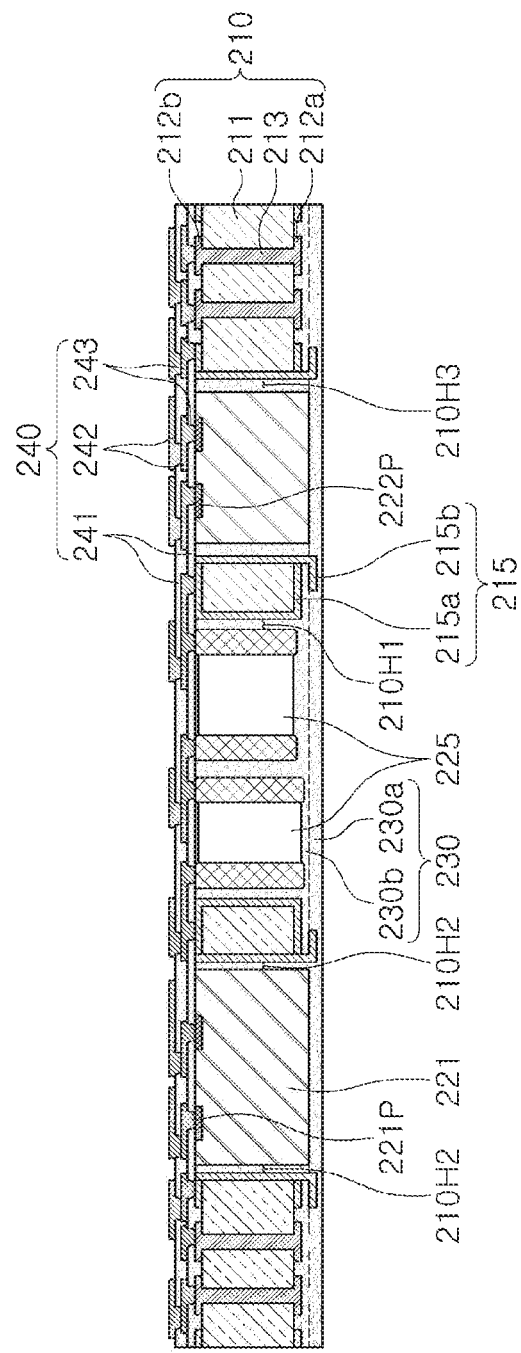

Referring to FIG. 15E, the connection structure 240 may be formed on the frame 210, the passive components 225, and the active surfaces of the first and second semiconductor chips 221 and 222 after removing the second adhesive film 280B.

The connection structure 240 may be formed by a method of forming an insulating layer 241 using a lamination or coating method, forming via holes in the insulating layer 241, and forming first redistribution layers 242 and redistribution vias 243 by electroplating or electroless plating. When a PID is used as the insulating layer 241, the via holes may be formed with a fine pitch using a photolithography method. Here, as illustrated in FIG. 13, there is no redistribution layer 242 in a region overlapping with the second feed pattern 112F, such that opened regions (Op) in which the insulating layer 241 is partially exposed may be formed.

Figure 15F:
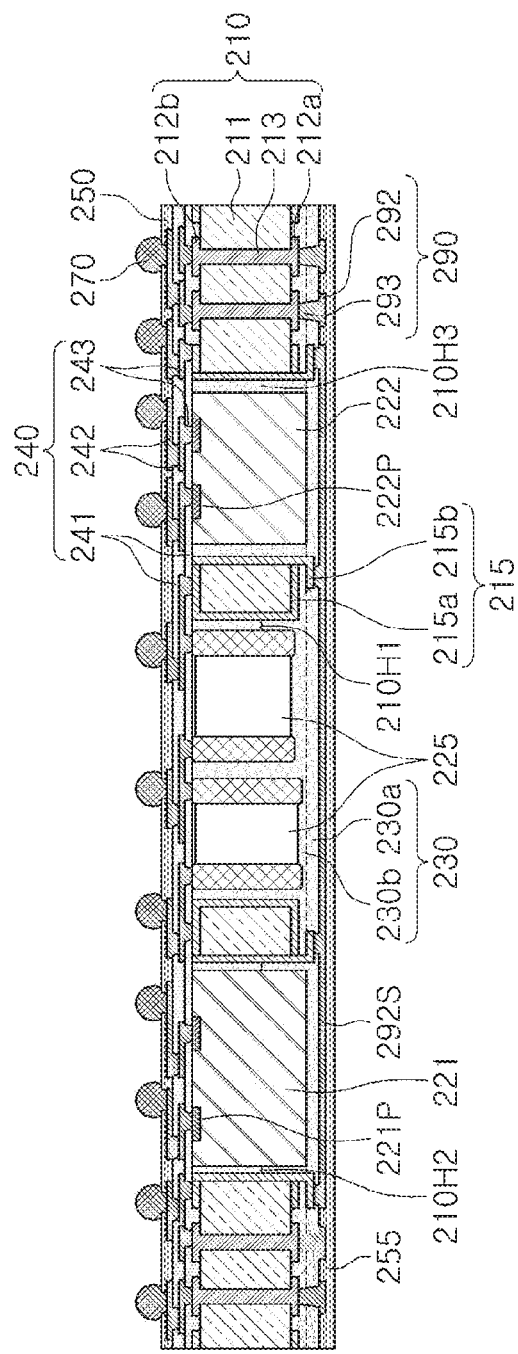

Referring to FIG. 15F, a backside wiring structure 290 including backside wiring layers 292 and backside vias 293 may be formed on the lower surface of the encapsulant 230, and a passivation layer 250 covering the connection member 240 and a backside passivation layer 255 covering the backside wiring structure 290 may be formed. In addition, openings exposing at least portions of the redistributions 242 may be formed in the passivation layer 250, and electrical connection metals 270 may be formed on the openings. The backside vias 293 may penetrate through the encapsulant 230 and connect the backside wiring layers 292 and the wiring layer 212 to each other. The backside wiring layers 292 and the backside vias 293 may be formed by a plating process. The passivation layer 250 may be formed by a method of laminating a precursor of the passivation layer 250 and then curing the precursor, a method of applying a material of the passivation layer 250 and then curing the material, or the like. The backside passivation layer 255 may be formed in the same manner, and may be formed simultaneously with the passivation layer 250 or may be formed by a separate process. A method of forming the electrical connection metals 270 is not particularly limited. That is, the electrical connection metals 270 may be formed by the method which is well-known in the related art depending on their structures or forms. The electrical connection metals 270 may be fixed by reflow, and some of the electrical connection metals 270 may be buried in the passivation layer 250 in order to enhance fixing force and the remaining portions of the electrical connection metals 270 may be exposed to the outside, whereby reliability may be improved. Separate underbump metal layers may be further disposed below the electrical connection metals 270. The semiconductor package 200 may be ultimately manufactured through the processes as described above.

Figure 16:
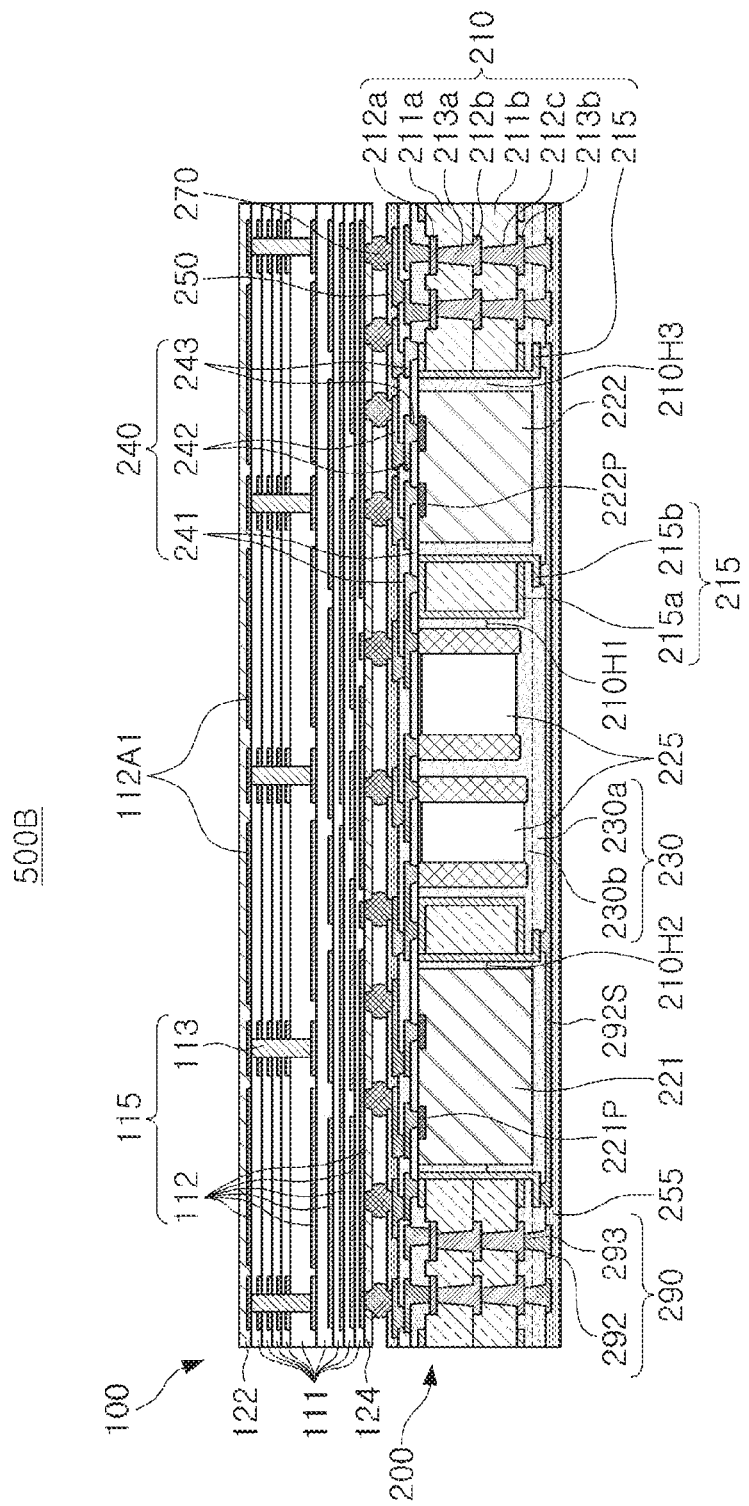
FIGS. 16 and 17 are schematic cross-sectional views illustrating an antenna module according to various exemplary embodiments in the present disclosure.
Figure 17:
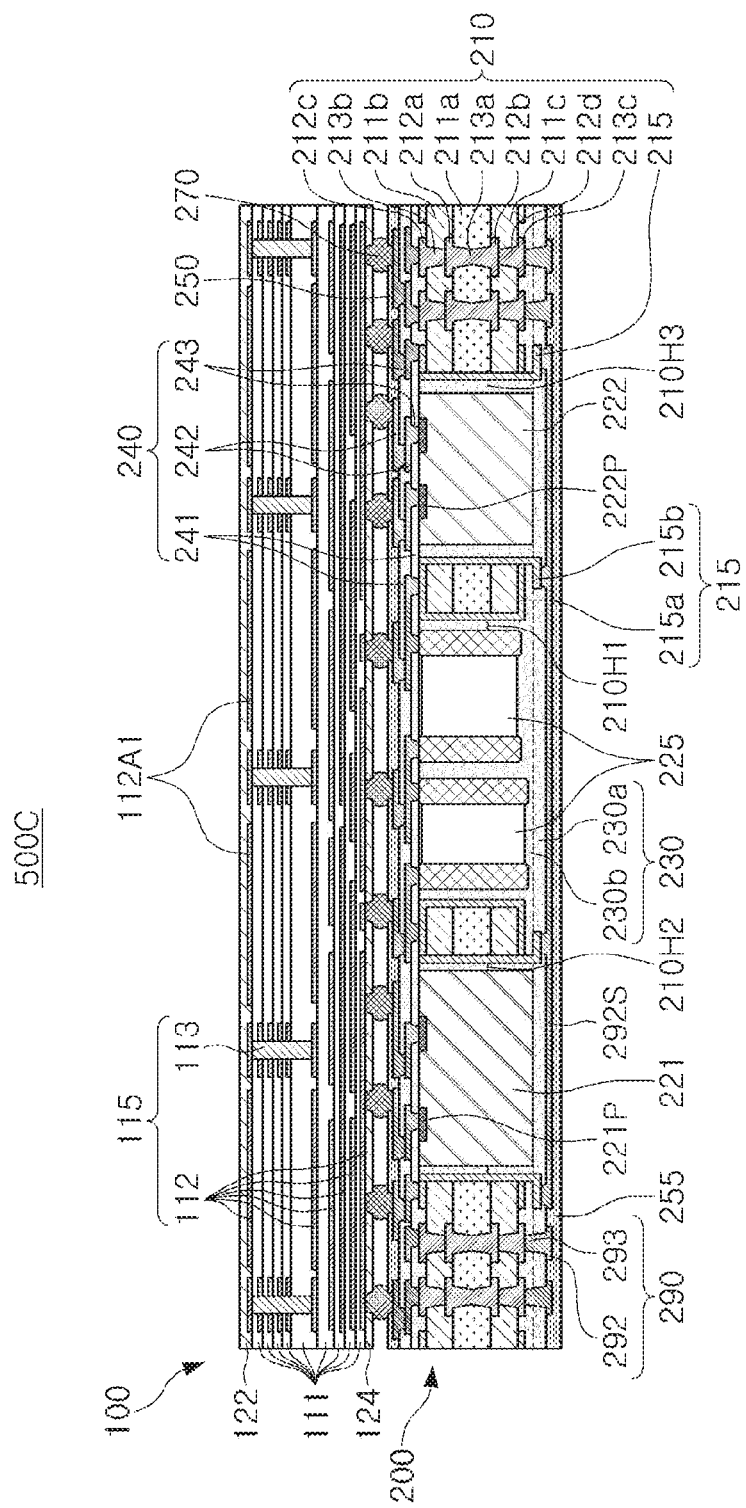

FIGS. 16 and 17 are schematic cross-sectional views illustrating an antenna module according to various exemplary embodiments in the present disclosure.

Referring to FIG. 16, an antenna module 500B according to the present exemplary embodiment may be understood to be similar to the structure illustrated in FIGS. 9 through 13, except for the form of the wiring structure of the frame 110. Components according to the present exemplary embodiment may be understood with reference to the description for the same or similar components of the antenna module 500B illustrated in FIGS. 9 through 13, unless explicitly described to the contrary.

In an antenna module 500B according to the present exemplary embodiment, a frame 210 of a semiconductor package 200A may include a first insulating layer 211a in contact with connection structure 240, a first wiring layer 212a in contact with the connection structure 240 and embedded in the first insulating layer 211a, a second wiring layer 212b disposed on the other surface of the first insulating layer 211a opposing one surface of the first insulating layer 211a in which the first wiring layer 212a is embedded, a second insulating layer 211b disposed on the first insulating layer 211a and covering the second wiring layer 212b, and a third wiring layer 212c disposed on the second insulating layer 211b. Since the frame 210 includes a larger number of wiring layers 212a, 212b, and 212c, the connection structure 240 may be further simplified.

Therefore, a decrease in a yield depending on a defect occurring in a process of forming the connection structure 240 may be suppressed. Meanwhile, the first to third wiring layers 212a, 212b, and 212c may be electrically connected to connection pads 221P and 222P. The first and second wiring layers 212a and 212b and the second and third wiring layers 212b and 212c may be electrically connected to each other through first and second vias 213a and 213b penetrating through the first and second insulating layers 211a and 211b, respectively.

The first wiring layer 212a may be recessed into the first insulating layer 211a. As described above, when the first wiring layer 212a is recessed into the first insulating layer 211a, such that the lower surface of the first insulating layer 211a and the lower surface of the first wiring layer 212a have a step therebetween, a phenomenon in which a material of the encapsulant 230 bleeds to pollute the first wiring layer 212a may be prevented. A thickness of each of the wiring layers 212a, 212b, and 212c of the frame 210 may be greater than those of the redistribution layers 242 of the connection structure 240.

When holes for the first vias 213a are formed, some of the pads of the first wiring layer 212a may serve as a stopper, and it may thus be advantageous in a process that each of the first vias 213a has a tapered shape of which a width of an upper surface is less than that of a lower surface. In this case, the first vias 213a may be integrated with pad patterns of the second wiring layer 212b. In addition, when holes for the second vias 213b are formed, some of the pads of the second wiring layer 212b may serve as a stopper, and it may thus be advantageous in a process that each of the second vias 213b has a tapered shape of which a width of an upper surface is less than that of a lower surface. In this case, the second vias 213b may be integrated with pad patterns of the third wiring layer 212c.

Referring to FIG. 17, an antenna module 500C according to the present exemplary embodiment may be understood to be similar to the structure illustrated in FIGS. 9 through 13, except for the form of the wiring structure of the frame 110. Components according to the present exemplary embodiment may be understood with reference to the description for the same or similar components of the antenna module 500C illustrated in FIGS. 9 through 13, unless explicitly described to the contrary.

In an antenna module 500C according to the present exemplary embodiment, a frame 210 of a semiconductor package 200B may include a first insulating layer 211a, a first wiring layer 212a and a second wiring layer 212b disposed on opposite surfaces of the first insulating layer 211a, a second insulating layer 211b disposed on the first insulating layer 211a and covering the first wiring layer 212a, a third wiring layer 212c disposed on the second insulating layer 211b, a third insulating layer 211c disposed on the first insulating layer 211a and covering the second wiring layer 212b, and a fourth wiring layer 212d disposed on the third insulating layer 211c. The first to fourth wiring layers 212a, 212b, 212c, and 212d may be electrically connected to connection pads 221P and 222P. Since the frame 210 may include a larger number of wiring layers 212a, 212b, 212c, and 212d, the connection structure 240 may be further simplified.

Therefore, a decrease in a yield depending on a defect occurring in a process of forming the connection structure 240 may be suppressed. Meanwhile, the first to fourth wiring layers 212a, 212b, 212c, and 212d may be electrically connected to each other through first to third vias 213a, 213b, and 213c each penetrating through the first to third insulating layers 211a, 211b, and 211c.

The first insulating layer 211a may have a thickness greater than that of each of the second insulating layer 211b and the third insulating layer 211c. The first insulating layer 211a may be basically relatively thick in order to maintain rigidity, and the second insulating layer 211b and the third insulating layer 211c may be introduced in order to form a larger number of wiring layers 212c and 212d. The first insulating layer 211a may include an insulating material different from those of the second insulating layer 211b and the third insulating layer 211c. For example, the first insulating layer 211a may be, for example, prepreg including a core material, a filler, and an insulating resin, and the second insulating layer 211b and the third insulating layer 211c may be an ABF or a PID film including a filler and an insulating resin. However, the materials of the first insulating layer 211a and the second and third insulating layers 211b and 211c are not limited thereto. Similarly, the first vias 213a penetrating through the first insulating layer 211a may have a diameter greater than those of second and third vias 213b and 213c penetrating through the second and the third insulating layers 211b and 211c, respectively. A thickness of each of the wiring layers 212a, 212b, 212c, and 212d of the frame 210 may be greater than that of each of the redistribution layers 242 of the connection structure 240.

The meaning of a "connection" of a component to another component in the description includes an indirect connection through an adhesive layer as well as a direct connection between two components. In addition, "electrically connected" means the concept including a physical connection and a physical disconnection. It can be understood that when an element is referred to with "first" and "second", the element is not limited thereby. They may be used only for a purpose of distinguishing the element from the other elements, and may not limit the sequence or importance of the elements. In some cases, a first component may be named a second component and a second component may also be similarly named a first component, without departing from the scope of the present disclosure.

The term "an exemplary embodiment" used herein does not refer to the same exemplary embodiment, and is provided to emphasize a particular feature or characteristic different from that of another exemplary embodiment. However, exemplary embodiments provided herein are considered to be able to be implemented by being combined in whole or in part one with another. For example, one element described in a particular exemplary embodiment, even if it is not described in another exemplary embodiment, may be understood as a description related to another exemplary embodiment, unless an opposite or contradictory description is provided therein.

Terms used herein are used only in order to describe an exemplary embodiment rather than limiting the present disclosure. In this case, singular forms include plural forms unless interpreted otherwise in context.

As set forth above, according to the exemplary embodiments in the present disclosure, the radiation pattern of the antenna may be maintained and the gain deterioration thereof may be prevented by removing the conductor positioned in the region adjacent to the antenna pattern. Meanwhile, since the size of the semiconductor package may be sufficiently secured while significantly reducing the influence of the radiation pattern, the degree of freedom of design of the semiconductor package (in particular, the degree of freedom of component arrangement) may be increased.

Various advantages and effects of the present disclosure are not limited to the description above, and may be more readily understood in the description of exemplary embodiments in the present disclosure.

While exemplary embodiments have been shown and described above, it will be apparent to those skilled in the art that modifications and variations could be made without departing from the scope of the present invention as defined by the appended claims.

What is claimed is:

1. An antenna module comprising:
an antenna substrate having a first surface and a second surface disposed to oppose each other, and including a substrate wiring layer having a first antenna pattern positioned in a first region of the substrate wiring layer, a second antenna pattern disposed in a second region of the substrate wiring layer adjacent to one side of the second surface of the antenna substrate, and a first feed pattern and a second feed pattern connected to the first and second antenna patterns, respectively; and
a semiconductor package including a connection structure disposed on the second surface except for an area overlapping with the second region of the antenna substrate and having a plurality of insulating layers and a plurality of redistribution layers disposed on the plurality of insulating layers and electrically connected to the substrate wiring layer, and at least one semiconductor chip having connection pads connected to the plurality of redistribution layers,
wherein a region overlapping with the second feed pattern in each of the plurality of redistribution layers is provided as an opened region.

2. The antenna module of claim 1, wherein the first antenna pattern includes a patch antenna, and
the second antenna pattern includes a dipole antenna.

3. The antenna module of claim 2, wherein the first region is a region adjacent to the first surface of the antenna substrate.

4. The antenna module of claim 1, wherein insulating patterns of the plurality of insulating layers extend from a side surface of connection structure and fill the opened regions, respectively.

5. The antenna module of claim 1, wherein the substrate wiring layer has ground patterns positioned on the second surface of the antenna substrate and having an opened region overlapping with the second antenna pattern and the second feed pattern.

6. The antenna module of claim 1, wherein the second antenna pattern is disposed in two or more side regions connected to each other.

7. The antenna module of claim 1, wherein the semiconductor package further includes:
a frame disposed on one surface of the connection structure and having a through-hole in which the at least one semiconductor chip is accommodated, and
an encapsulant encapsulating the at least one semiconductor chip.

8. The antenna module of claim 7, wherein the frame includes a wiring structure connected to the plurality of redistribution layers and penetrating through an insulating layer of the frame.

9. The antenna module of claim 7, wherein the semiconductor package further includes a passive component connected to the plurality of redistribution layers of the connection structure, and
the through-hole includes at least first and second through-holes, the passive component is accommodated in the first through-hole, and the at least one semiconductor chip is accommodated in the second through-hole.

10. The antenna module of claim 9, wherein the encapsulant includes:
a first encapsulant encapsulating the passive component positioned in the first through-hole and disposed on the frame; and
a second encapsulant encapsulating the at least one semiconductor chip positioned in the second through-hole and disposed on the first encapsulant.

11. The antenna module of claim 10, further comprising:
a first shielding layer disposed on an inner side wall of the first through-hole and extending to an adjacent surface of the frame; and
a second shielding layer disposed on an inner side wall of the second through-hole and extending to an adjacent surface of the first encapsulant.

12. The antenna module of claim 11, further comprising a third shielding layer disposed on the second encapsulant and covering the first and second through-holes.

13. An antenna module comprising:
an antenna substrate having a first surface and a second surface disposed to oppose each other, and including a substrate wiring layer having an antenna pattern and a feed pattern which are disposed in a region adjacent to at least one side of the second surface; and
a semiconductor package including a connection structure disposed on a region of the second surface of the antenna substrate so as not to be overlapped with the antenna pattern and having redistribution layers electrically connected to the substrate wiring layer, and at least one semiconductor chip having connection pads connected to the redistribution layers,
wherein only an insulating material is disposed in a region in the connection structure overlapping with the feed pattern.

14. The antenna module of claim 13, wherein the semiconductor package further includes a frame disposed on one surface of the connection structure, having a plurality of through-holes, and having a wiring structure connected to the redistribution layers and penetrating therethrough.

15. The antenna module of claim 14, wherein the at least one semiconductor chip includes a plurality of semiconductor chips disposed in the plurality of through-holes, respectively.

16. The antenna module of claim 15, wherein the plurality of semiconductor chips includes a radio frequency integrated circuit (RFIC) and a power management integrated circuit (PMIC).

17. The antenna module of claim 13, wherein the substrate wiring layer has ground patterns having an opened region overlapping with the antenna pattern and the feed pattern.

18. The antenna module of claim 13, wherein the semiconductor package further includes passive components connected to the redistribution layers.

* * * * *